(12) United States Patent
Kim et al.

(10) Patent No.: US 11,699,492 B2
(45) Date of Patent: Jul. 11, 2023

(54) STORAGE SYSTEM FOR ENHANCING DATA VALID WINDOWS OF SIGNALS

(71) Applicant: SAMSUNG ELECTRONICS CO., LTD., Suwon-si (KR)

(72) Inventors: TongSung Kim, Seongnam-si (KR); Dae Hoon Na, Seoul (KR); Jung-June Park, Seoul (KR); Dong Ho Shin, Hwaseong-si (KR); Byung Hoon Jeong, Hwaseong-si (KR); Young Min Jo, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 49 days.

(21) Appl. No.: 17/379,109

(22) Filed: Jul. 19, 2021

(65) Prior Publication Data
US 2022/0122675 A1     Apr. 21, 2022

(30) Foreign Application Priority Data
Oct. 20, 2020   (KR) .................. 10-2020-0135852

(51) Int. Cl.
*G06F 12/00*     (2006.01)
*G11C 16/32*     (2006.01)
(Continued)

(52) U.S. Cl.
CPC ............. *G11C 16/32* (2013.01); *G06F 1/10* (2013.01); *G06F 3/0604* (2013.01);
(Continued)

(58) Field of Classification Search
CPC ..... G11C 16/32; G11C 16/0483; G11C 16/26; G11C 7/1042; G11C 2207/2254;
(Continued)

(56) References Cited

U.S. PATENT DOCUMENTS 5,479,640 A * 12/1995 Cartman ............. G06F 12/0215
                                              711/212
6,658,509 B1 * 12/2003 Bonella ............... G06F 13/4243
                                              370/223

(Continued)

OTHER PUBLICATIONS

European Search report dated Mar. 4, 2022 with European Office action dated Mar. 16, 2022.

*Primary Examiner* — Mardochee Chery
(74) *Attorney, Agent, or Firm* — Lee IP Law, P.C.

(57) ABSTRACT

A storage system includes: a memory controller which provides a clock signal; a buffer which receives the clock signal and re-drives the clock signal, the buffer including a sampler which receives a data signal and a data strobe signal regarding the data signal, and which outputs a data stream; and a nonvolatile memory, including: a first duty cycle corrector, which receives the clock signal outputs a corrected clock signal by performing a first duty correction operation on the clock signal; and a data strobe signal generator, which generates the data strobe signal based on the corrected clock signal and provides the data strobe signal to the buffer. The buffer receives the data strobe signal output from the nonvolatile memory, senses a duty ratio of the data strobe signal input to the sampler, and performs a second duty correction operation on the duty ratio of the input data strobe signal.

18 Claims, 20 Drawing Sheets

(51) Int. Cl.
| | |
|---|---|
| *G06F 1/10* | (2006.01) |
| *G06F 3/06* | (2006.01) |
| *G11C 16/04* | (2006.01) |
| *G11C 16/26* | (2006.01) |
| *H01L 25/065* | (2023.01) |
| *H01L 25/18* | (2023.01) |

(52) U.S. Cl.
CPC .......... *G06F 3/0656* (2013.01); *G06F 3/0679* (2013.01); *G11C 16/0483* (2013.01); *G11C 16/26* (2013.01); *H01L 25/0657* (2013.01); *H01L 25/18* (2013.01); *H01L 2225/06562* (2013.01)

(58) Field of Classification Search
CPC ....... G11C 7/1066; G11C 7/222; G11C 16/24; G11C 7/1006; G11C 7/1051; G06F 1/10; G06F 3/0604; G06F 3/0656; G06F 3/0679; G06F 3/0658; H01L 25/0657; H01L 25/18; H01L 2225/06562
USPC ........................................................ 711/154
See application file for complete search history.

(56) References Cited

U.S. PATENT DOCUMENTS

| | | | |
|---|---|---|---|
| 7,127,629 B2* | 10/2006 | Vogt | G06F 13/4234 713/400 |
| 7,143,207 B2* | 11/2006 | Vogt | G06F 13/4243 710/33 |
| 8,130,016 B2* | 3/2012 | Nagarajan | H03L 7/0816 327/158 |
| 8,135,999 B2* | 3/2012 | Morrow | G06F 12/00 710/200 |
| 9,444,442 B2 | 9/2016 | Chandrasekaran et al. | |
| 9,966,934 B2 | 5/2018 | Choi et al. | |
| 10,418,978 B1 | 9/2019 | Au Yeung et al. | |
| 10,437,472 B2 | 10/2019 | Bhuiyan et al. | |
| 10,547,297 B2 | 1/2020 | Elbadry et al. | |
| 10,712,770 B1 | 7/2020 | Chiang et al. | |
| 2004/0250153 A1* | 12/2004 | Vogt | G06F 13/1689 713/500 |
| 2005/0108611 A1* | 5/2005 | Vogt | G06F 11/1004 714/758 |
| 2010/0083028 A1* | 4/2010 | Oh | G06F 1/08 713/600 |
| 2018/0350414 A1 | 12/2018 | Park et al. | |
| 2020/0059226 A1* | 2/2020 | Choi | H03K 5/1565 |
| 2020/0212917 A1 | 7/2020 | Zerbe et al. | |
| 2020/0302982 A1 | 9/2020 | Koh | |

\* cited by examiner

US 11,699,492 B2

STORAGE SYSTEM FOR ENHANCING DATA VALID WINDOWS OF SIGNALS

CROSS-REFERENCE TO RELATED APPLICATION

Korean Patent Application No. 10-2020-0135852, filed on Oct. 20, 2020 in the Korean Intellectual Property Office, and entitled: "Storage System," is incorporated by reference herein in its entirety.

BACKGROUND

1. Field

Embodiments relate to a storage system.

2. Description of the Related Art

When data is provided using a clock signal, it is important to secure a data valid window for a toggle signal generated using the clock signal.

According to the current trend of transmitting large amounts of data at high speed, research is being conducted toward increasing a toggling frequency of the toggle signal.

SUMMARY

Embodiments are directed to a storage system, including: a memory controller which provides a clock signal; a buffer which receives the clock signal output from the memory controller and re-drives the clock signal, the buffer including a sampler which receives a data signal and a data strobe signal regarding the data signal, and which outputs a data stream; and a nonvolatile memory, including: a first duty cycle corrector, which receives the clock signal through the buffer and outputs a corrected clock signal by performing a first duty correction operation on the clock signal; and a data strobe signal generator, which generates the data strobe signal based on the corrected clock signal and provides the data strobe signal to the buffer. The buffer may receive the data strobe signal output from the nonvolatile memory, senses a duty ratio of the data strobe signal input to the sampler, and may perform a second duty correction operation on the duty ratio of the input data strobe signal.

Embodiments are also directed to a storage system, including: a memory controller which provides a clock signal; a buffer which receives the clock signal from the memory controller and re-drives the clock signal; and a nonvolatile memory which includes a first comparator sensing a duty ratio of the clock signal, a first logic generating a first digital code regarding the duty ratio of the clock signal, a first duty cycle corrector receiving the clock signal and the first digital code and outputting a corrected clock signal by performing a first duty correction operation on the clock signal, and a data strobe signal generator generating a data strobe signal based on the corrected clock signal and providing the data strobe signal to the buffer. The buffer may include a second comparator which senses a duty ratio of the data strobe signal received from the nonvolatile memory, a second logic which generates a second digital code regarding the duty ratio of the data strobe signal, and a second duty cycle corrector which receives the clock signal and the second digital code and performs a second duty correction operation on the clock signal.

Embodiments are also directed to a storage system, including: a memory controller which provides a clock signal; a buffer which receives the clock signal output from the memory controller and re-drives the clock signal; a first nonvolatile memory which includes a first duty cycle corrector receiving the clock signal from the buffer through a first channel and outputting a first corrected clock signal by performing a first duty correction operation on the clock signal, and includes a first data strobe signal generator generating a first data strobe signal based on the first corrected clock signal and providing the first data strobe signal to the buffer; and a second nonvolatile memory which includes a second duty cycle corrector receiving the clock signal from the buffer through a second channel different from the first channel and outputting a second corrected clock signal by performing a second duty correction operation on the clock signal, and includes a second data strobe signal generator generating a second data strobe signal based on the second corrected clock signal and providing the second data strobe signal to the buffer. The buffer may sense a first duty ratio of the first data strobe signal received from the first nonvolatile memory through the first channel, perform a third duty correction operation on the first duty ratio, sense a second duty ratio of the second data strobe signal received from the second nonvolatile memory through the second channel, and perform a fourth duty correction operation on the second duty ratio.

BRIEF DESCRIPTION OF THE DRAWINGS

Features will become apparent to those of skill in the art by describing in detail example embodiments with reference to the attached drawings in which.

DETAILED DESCRIPTION

Figure 1:
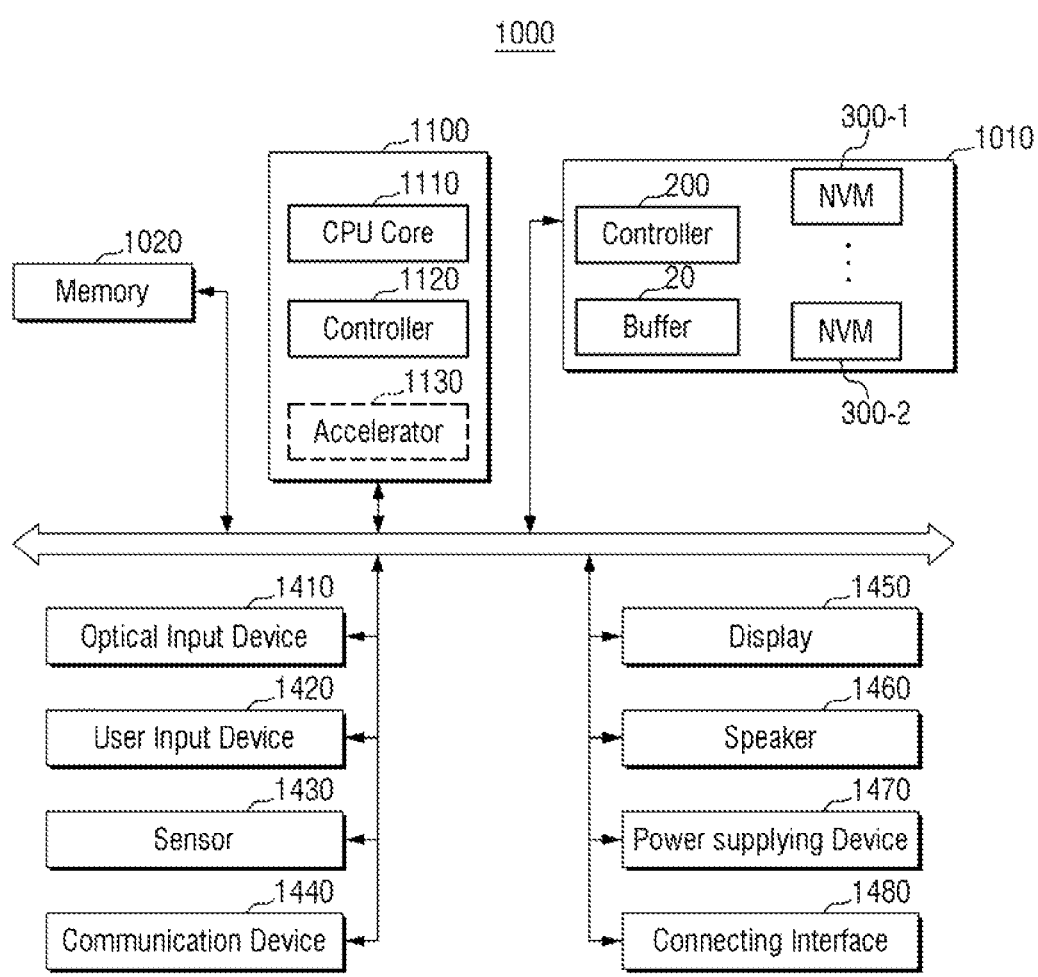
FIG. 1 is a block diagram of a system to which a storage system according to example embodiments is applied.

FIG. 1 is a block diagram of a system 1000 to which a storage system according to example embodiments is applied.

Referring to FIG. 1, the system 1000 of FIG. 1 may be, e.g., a mobile system such as a portable communication terminal (mobile phone), a smartphone, a tablet personal computer, a wearable device, a healthcare device, or an Internet of things (IOT) device. However, the system 1000 of FIG. 1 is not limited to the mobile system and may also be, e.g., a personal computer, a laptop computer, a server, a media player, or an automotive device such as a navigation device.

Referring to FIG. 1, the system 1000 may include a main processor 1100, a memory 1020, and a storage device 1010. The system may include an optical input device 1410, a user input device 1420, a sensor 1430, a communication device 1440, a display 1450, a speaker 1460, a power supplying device 1470, and a connecting interface 1480.

The main processor 1100 may control the overall operation of the system 1000, e.g., may control the operations of other components constituting the system 1000. The main processor 1100 may be implemented as a general-purpose processor, a dedicated processor, or an application processor.

The main processor 1100 may include one or more central processing unit (CPU) cores 1110, and may include a controller 1120 for controlling the memory 1020 and/or the storage device 1010. According to an example embodiment, the main processor 1100 may further include an accelerator block 1130 which is a dedicated circuit for high-speed data operation such as artificial intelligence (AI) data operation. The accelerator block 1130 may include a graphics processing unit (GPU), a neural processing unit (NPU), and/or a data processing unit (DPU), and may be implemented as a separate chip physically independent of other components of the main processor 1100.

The memory 1020 may be used as a main memory device of the system 1000, and may include a volatile memory such as a static random access memory (SRAM) and/or a dynamic random access memory (DRAM), but may also include a nonvolatile memory such as a flash memory, a phase-change random access memory (PRAM), and/or a resistive random access memory (RRAM). The memory 1020 may also be implemented in the same package as the main processor 1100. Although the memory 1020 is provided in a singular number in the drawing, example embodiments are not limited thereto, and the memory 1020 may also be provided in plural numbers according to an example embodiment.

The storage device 1010 may function as a nonvolatile storage device that stores data regardless of whether power is supplied, and may have a relatively larger storage capacity than the memory 1020. Although the storage device 1010 is provided in a singular number in the drawing, example embodiments are not limited thereto, and the storage device 1010 may also be provided in plural numbers according to an example embodiment.

The storage device 1010 may include a memory controller 200, a buffer 20 which re-drives a signal of the memory controller 200, and first and second nonvolatile memories 300-1 and 300-2 which store data under the control of the memory controller 200. The first and second nonvolatile memories 300-1 and 300-2 may include V-NAND flash memories having a two-dimensional (2D) or three-dimensional (3D) structure, but may also include other types of nonvolatile memories such as PRAMs and/or RRAMs.

The storage device 1010 included in the system 1000 may be physically separated from the main processor 1100 or may be implemented in the same package as the main processor 1100. The storage device 1010 may be in the form of a memory card and thus may be detachably coupled to other components of the system 1000 through an interface such as the connecting interface 1480 which are described below. The storage device 1010 may be, e.g., a device to which a standard protocol such as universal flash storage (UFS) is applied.

The optical input device 1410 may capture still images or moving images, and may be a camera, a camcorder, and/or a webcam.

The user input device 1420 may receive various types of data from a user of the system 1000, and may be a touch pad, a keypad, a keyboard, a mouse and/or a microphone.

The sensor 1430 may detect various types of physical quantities that can be obtained from outside the system 1000, and may convert the detected physical quantities into electrical signals. The sensor 1430 may be a temperature sensor, a pressure sensor, an illuminance sensor, a position sensor, an acceleration sensor, a biosensor, and/or a gyroscope.

The communication device 1440 may transmit and receive signals to and from other devices outside the system 1000 according to various communication protocols. The communication device 1440 may include an antenna, a transceiver, and/or a modem.

The display 1450 and the speaker 1460 may function as output devices that output visual information and audio information to the user of the system 1000, respectively.

The power supplying device 1470 may convert power supplied from a battery (not illustrated) built in the system 1000 and/or an external power source, and supply the power to each component of the system 1000.

The connecting interface 1480 may provide a connection between the system 1000 and an external device which is connected to the system 1000 to exchange data with the system 1000. The connecting interface 1480 may be implemented as various interfaces such as advanced technology attachment (ATA), serial-ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (eMMC), universal flash storage (UFS), embedded universal flash storage (eUFS), and compact flash (CF) card interface.

Figure 2:
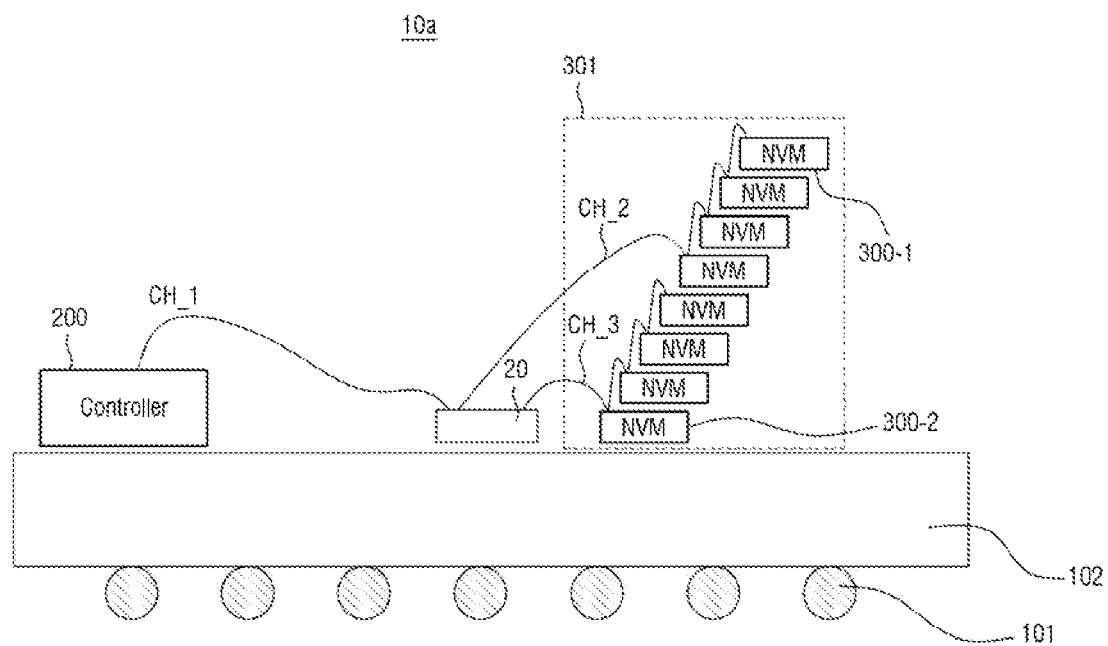
FIG. 2 illustrates a semiconductor package including a storage system according to example embodiments.

FIG. 2 illustrates a semiconductor package 10*a* including a storage system according to example embodiments.

Referring to FIG. 2, the semiconductor package 10*a* according to example embodiments may include the first nonvolatile memory 300-1 and the second nonvolatile memory 300-2 (collectively, 301), and the memory controller 200.

The first nonvolatile memory 300-1, the second nonvolatile memory 300-2, and the memory controller 200 may be disposed on a same substrate 102. A plurality of external connection terminals 101 may be formed under the substrate 102 to receive an external electrical signal.

The first nonvolatile memory 300-1 and/or the second nonvolatile memory 300-2 may be selected from or include, e.g., include NAND flash memories, vertical NAND (VNAND) flash memories, NOR flash memories, RRAMs, PRAMs, magnetoresistive random access memories (MRAMs), ferroelectric random access memories (FRAMs), or spin transfer torque random access memories (STT-RAMs). According to example embodiments, the first nonvolatile memory 300-1 and/or the second nonvolatile memory 300-2 may include a 3D array structure.

The first nonvolatile memory 300-1 and the second nonvolatile memory 300-2 may be disposed on the substrate 102, and each of the first nonvolatile memory 300-1 and/or the second nonvolatile memory 300-2 may include a plurality of nonvolatile memory chips. The form of the nonvolatile memory chips included in the first nonvolatile memory 300-1 and the second nonvolatile memory 300-2 is not limited to the form illustrated in this drawing.

The buffer 20 may be disposed on the substrate 102, and may be electrically connected to the first nonvolatile memory 300-1 and the second nonvolatile memory 300-2. For example, the buffer 20 may be electrically connected to one or more of the first nonvolatile memory 300-1 through a first channel CH_1 via a conducting wire, and may be electrically connected to one or more of the second nonvolatile memory 300-2 through a second channel CH_2 via a conducting wire.

The memory controller 200 may be disposed on the substrate 102, and may be connected to the buffer 20 through a zero$^{th}$ channel CH_0 via a conducting wire. The memory controller 200 may include a plurality of input/output terminals to receive an external electrical signal (e.g., a command signal, an address signal, and/or data) through the external connection terminals 101, and may include a redistribution layer (not illustrated) disposed in the substrate 102 and configured to transmit an electrical signal to the buffer 20 based on the received external electrical signal.

In some example embodiments, the conducting wire included in the zero$^{th}$ channel CH_0 may be longer than the conducting wire included in the first channel CH_1 or the conducting wire included in the second channel CH_2.

In the drawings, the external connection terminals 101 may be illustrated as solder balls, but example embodiments are not limited thereto and the external connection terminals 101 may also be, e.g., solder bumps, a grid array, or conductive tabs.

The external connection terminals 101 may include gold (Au), silver (Ag), copper (Cu), nickel (Ni), or aluminum (Al). The number and arrangement of the external connection terminals 101 are not limited to the number and arrangement in the drawings.

Figure 3:
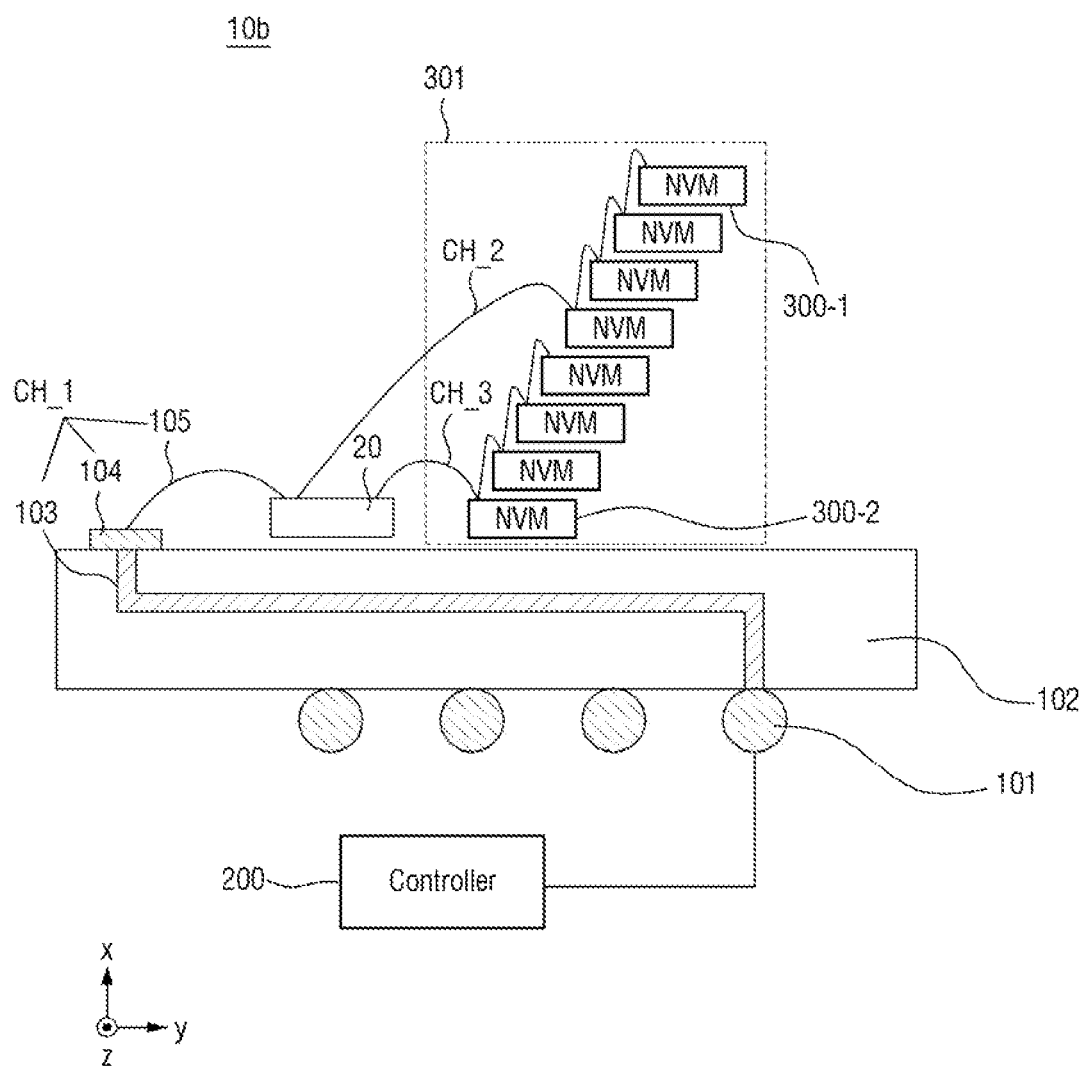
FIG. 3 illustrates another semiconductor package including a storage system according to example embodiments.

FIG. 3 illustrates another semiconductor package 10b including a storage system according to example embodiments.

The semiconductor package 10b according to example embodiments will now be described with reference to FIG. 3. The following description will focus on differences from the semiconductor package 10a illustrated in FIG. 2.

First nonvolatile memory 300-1, second nonvolatile memory 300-2, and the buffer 20 may be disposed on the same substrate 102, and the memory controller 200 may be connected to the buffer 20 through the zero$^{th}$ channel CH_0.

The zero$^{th}$ channel CH_0 may include a redistribution layer 103, a buffer pad 104, and a conducting wire 105.

The redistribution layer 103 may be disposed inside the substrate 102. The redistribution layer 103 may also be electrically connected to at least some of the plurality of external connection terminals 101. The redistribution layer 103 and the external connection terminals 101 may include gold (Au), silver (Ag), copper (Cu), nickel (Ni), or aluminum (Al).

The buffer pad 104 may be disposed on the substrate 102, and may be connected to the redistribution layer 103 disposed inside the substrate 102. The buffer pad 104 may include a conductive material. For example, the buffer pad 104 may include gold (Au), silver (Ag), copper (Cu), nickel (Ni), or aluminum (Al). The buffer pad 104 may be electrically connected to the buffer 20 through the conducting wire 105.

An external electrical signal (e.g., a zero$^{th}$ channel signal) transmitted from the memory controller 200 may be transmitted to at least one of the external connection terminals 101 included in the zero$^{th}$ channel CH_0.

Thus, an external electrical signal (e.g., the zero$^{th}$ channel signal) transmitted from the memory controller 200 may be transmitted to at least one of the external connection terminals 101 included in the zero$^{th}$ channel CH_0. The at least one of the external connection terminals 101 may be electrically connected to the redistribution layer 103, and the redistribution layer 103 may be electrically connected to the buffer pad 104. Thus, the external electrical signal (e.g., the zero$^{th}$ channel signal) transmitted from the memory controller 200 may be transmitted to the first nonvolatile memory 300-1 and the second nonvolatile memory 300-2 through the buffer 20.

In an example embodiment, the first nonvolatile memory 300-1 and the second nonvolatile memory 300-2 may receive an external electrical signal (e.g., a command signal, an address signal, and/or data) through the buffer 20 and the zero$^{th}$ channel CH_0.

Figure 4:
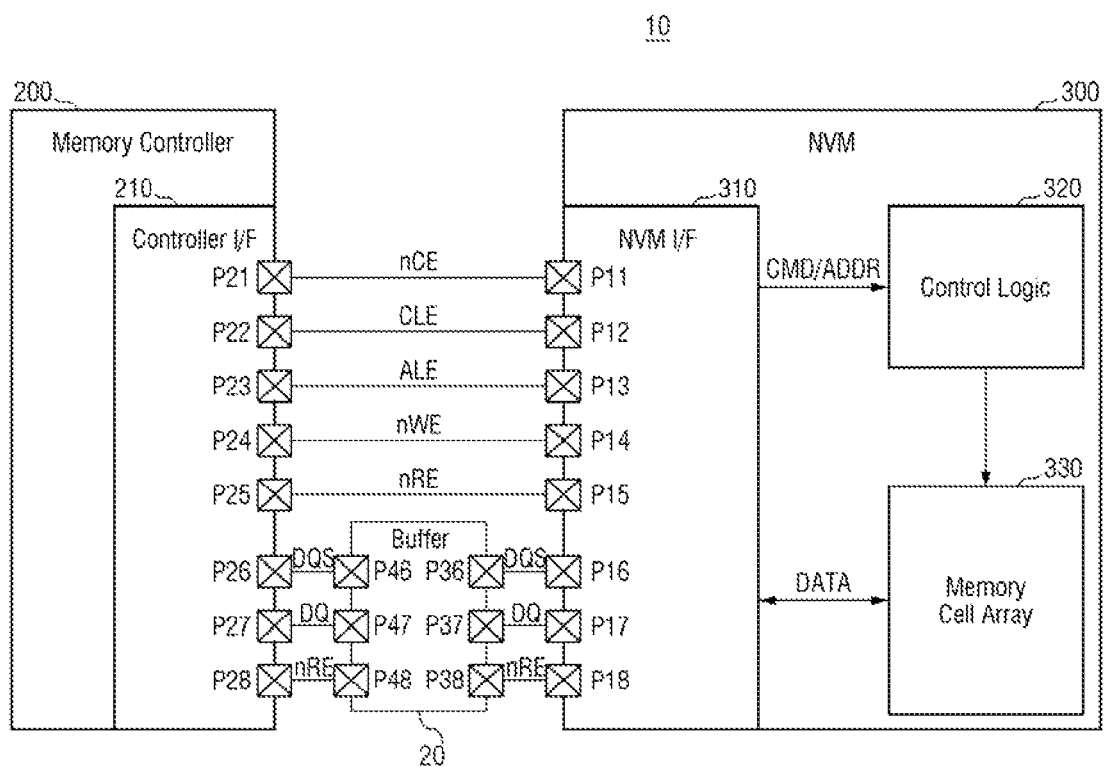
FIG. 4 is a block diagram of a storage system according to example embodiments.

FIG. 4 is a block diagram of a storage system 10 according to example embodiments.

Referring to FIG. 4, the storage system 10 may include the memory controller 200, the buffer 20, and a nonvolatile memory 300. The memory controller 200 may correspond to the memory controller 200 of FIGS. 1 through 3. The buffer 20 may correspond to the buffer 20 of FIGS. 1 through 3. The nonvolatile memory 300 may correspond to one of the first and second nonvolatile memories 300-1 and 300-2 of FIGS. 1 through 3, and may communicate with the memory controller 200 based on one of a plurality of channels.

The memory controller 200 may include a controller interface circuit 210 and first through eighth pins P21 through P28, which may correspond to first through eighth pins P11 through P18 of the nonvolatile memory 300, as described below. Additional aspects of the memory controller 200 will also be described below.

The buffer 20 may include (6-1)$^{th}$ through (8-1)$^{th}$ pins P36 through P38 and (6-2)$^{th}$ through (8-2)$^{th}$ pins P46 through P48. The (6-1)$^{th}$ through (8-1)$^{th}$ pins P36 through P38 may correspond to the sixth through eighth pins P16 through P18 of the nonvolatile memory 300 which are described below. The (6-2)$^{th}$ through (8-2)$^{th}$ pins P46 through P48 may correspond to the sixth through eighth pins P26 through P28 of the memory controller 200 which are described below.

In an example embodiment, a data strobe signal DQS, a data signal DQ, and a read enable signal nRE are transmitted and received between the memory controller 200 and the nonvolatile memory 300 via the (6-1)$^{th}$ pin P36 and the (6-2)$^{th}$ pin P46 of the buffer 20, via the (7-1)$^{th}$ pin P37 and the (7-2)$^{th}$ pin P47 of the buffer 20, and via the (8-1)$^{th}$ pin P38 and the (8-2)$^{th}$ pin P48 of the buffer 20, respectively.

The buffer 20 may re-drive the data strobe signal DQS, the data signal DQ, and the read enable signal nRE passing through the buffer 20 by amplifying intensities of the data strobe signal DQS, the data signal DQ, and the read enable signal nRE, and may perform a duty correction operation for correcting duty distortion of the data strobe signal DQS, the data signal DQ, and the read enable signal nRE. Example components included in the buffer 20 are described below.

The nonvolatile memory 300 may include the first through eighth pins P11 through P18, a memory interface circuit 310, a control logic circuit 320, and a memory cell array 330.

The memory interface circuit 310 may receive a chip enable signal nCE from the memory controller 200 through the first pin P11. The memory interface circuit 310 may transmit and receive signals to and from the memory controller 200 through the second through eighth pins P12 through P18 according to the chip enable signal nCE. For example, when the chip enable signal nCE is enabled (e.g., a low level), the memory interface circuit 310 may transmit and receive signals to and from the memory controller 200 through the second through eighth pins P12 through P18.

The memory interface circuit 310 may receive a command latch enable signal CLE, an address latch enable signal ALE, and a write enable signal nWE from the memory controller 200 through the second through fourth pins P12 through P14. The memory interface circuit 310 may receive the data signal DQ from the buffer 20 or transmit the data signal DQ to the buffer 20 through the seventh pin P17. A command CMD, an address ADDR, and data DATA may be transmitted through the data signal DQ. For example, the data signal DQ may be transmitted through a plurality of data signal lines. In this case, the seventh pin P17 may include a plurality of pins corresponding to a plurality of data signal lines.

The memory interface circuit 310 may obtain the command CMD from the data signal DQ received in an enable period (e.g., a high level state) of the command latch enable signal CLE based on toggle timings of the write enable signal nWE. The memory interface circuit 310 may obtain the address ADDR from the data signal DQ received in an enable period (e.g., a high level state) of the address latch enable signal ALE based on the toggle timings of the write enable signal nWE.

In an example embodiment, the write enable signal nWE may maintain a static state (e.g., a high level or a low level) and then toggle between a high level and a low level. For example, the write enable signal nWE may toggle in a period in which the command CMD or the address ADDR is transmitted. Accordingly, the memory interface circuit 310 may obtain the command CMD or the address ADDR based on the toggle timings of the write enable signal nWE.

The memory interface circuit 310 may transmit a ready/busy output signal nR/B to the memory controller 200 through the fifth pin P15. The memory interface circuit 310 may transmit state information of the nonvolatile memory 300 to the memory controller 200 through the ready/busy output signal nR/B. When the nonvolatile memory 300 is in a busy state (that is, when internal operations of the nonvolatile memory 300 are being performed), the memory interface circuit 310 may transmit the ready/busy output signal nR/B indicating the busy state to the memory controller 200. When the nonvolatile memory 300 is in a ready state (that is, when the internal operations of the nonvolatile memory 300 are not performed or are completed), the memory interface circuit 310 may transmit the ready/busy output signal nR/B indicating the ready state to the memory controller 200. For example, while the nonvolatile memory 300 reads the data DATA from the memory cell array 330 in response to a page read command, the memory interface circuit 310 may transmit the ready/busy output signal nR/B indicating the busy state (e.g., a low level) of the memory interface circuit 310 to the memory controller 200. For example, while the nonvolatile memory 300 programs the data DATA into the memory cell array 330 in response to a program command, the memory interface circuit 310 may transmit the ready/busy output signal nR/B indicating the busy state to the memory controller 200.

The memory interface circuit 310 may receive the read enable signal nRE from the buffer 20 through the eighth pin P18. The memory interface circuit 310 may receive the data strobe signal DQS from the buffer 20 or transmit the data strobe signal DQS to the buffer 20 through the sixth pin P16.

In a data output operation of the nonvolatile memory 300, the memory interface circuit 310 may receive the read enable signal nRE that toggles through the eighth pin P18 before outputting the data DATA. The memory interface circuit 310 may generate the data strobe signal DQS that toggles based on the toggling of the read enable signal nRE. For example, the memory interface circuit 310 may generate the data strobe signal DQS that starts to toggle after a predetermined delay (which may be referred to as, e.g., tDQSRE) based on a toggling start time of the read enable signal nRE. The memory interface circuit 310 may transmit the data signal DQ including the data DATA based on the toggle timing of the data strobe signal DQS. Accordingly, the data DATA may be aligned with the toggle timing of the data strobe signal DQS and transmitted to the buffer 20.

The control logic circuit 320 may generally control various operations of the nonvolatile memory 300. The control logic circuit 320 may receive the obtained command/address CMD/ADDR from the memory interface circuit 310. The control logic circuit 320 may generate control signals for controlling other components of the nonvolatile memory 300 according to the received command/address CMD/ADDR. For example, the control logic circuit 320 may program the data DATA into the memory cell array 330 or generate various control signals for reading the data DATA from the memory cell array 330.

The memory cell array 330 may store the data DATA obtained from the memory interface circuit 310 under the control of the control logic circuit 320. The memory cell array 330 may output the stored data DATA to the memory interface circuit 310 under the control of the control logic circuit 320.

The memory cell array 330 may include a plurality of memory cells. For example, the memory cells may be flash memory cells. However, example embodiments are not limited thereto, and the memory cells may also be RRAM cells, FRAM cells, PRAM cells, thyristor random access memory (TRAM) cells, or MRAM cells. Example embodiments are described below focusing on an embodiment in which the memory cells are NAND flash memory cells.

The memory controller 200 may include the first through eighth pins P21 through P28 and the controller interface circuit 210. The first through eighth pins P21 through P28 may correspond to the first through eighth pins P11 through P18 of the nonvolatile memory 300.

The controller interface circuit 210 may transmit the chip enable signal nCE to the nonvolatile memory 300 through the first pin P21. The controller interface circuit 210 may transmit and receive signals to and from the nonvolatile memory 300, which is selected through the chip enable signal nCE, through the second through eighth pins P22 through P28.

The controller interface circuit 210 may transmit the command latch enable signal CLE, the address latch enable signal ALE, and the write enable signal nWE to the nonvolatile memory 300 through the second through fourth pins P22 through P24. The controller interface circuit 210 may transmit the data signal DQ to the nonvolatile memory 300 or receive the data signal DQ from the nonvolatile memory 300 through the seventh pin P27.

The controller interface circuit 210 may transmit the write enable signal nWE that toggles, and may transmit the data signal DQ including the command CMD or the address ADDR to the nonvolatile memory 300 via the buffer 20 together with the transmission of the write enable signal nWE. The controller interface circuit 210 may transmit the data signal DQ including the command CMD to the nonvolatile memory 300 by transmitting the enabled command latch enable signal CLE, and may transmit the data signal DQ including the address ADDR to the nonvolatile memory 300 by transmitting the enabled address latch enable signal ALE.

The controller interface circuit 210 may receive the ready/busy output signal nR/B from the nonvolatile memory 300 through the fifth pin P25. The controller interface circuit 210 may determine state information of the nonvolatile memory 300 based on the ready/busy output signal nR/B.

The controller interface circuit 210 may transmit the read enable signal nRE to the nonvolatile memory 300 through the eighth pin P28. The controller interface circuit 210 may receive the data strobe signal DQS from the nonvolatile memory 300 or transmit the data strobe signal DQS to the nonvolatile memory 300 through the sixth pin P26.

In a data output operation of the nonvolatile memory 300, the controller interface circuit 210 may generate the read enable signal nRE that toggles and transmit the read enable signal nRE to the nonvolatile memory 300. For example, the controller interface circuit 210 may generate the read enable signal nRE that changes from a static state (e.g., a high level or a low level) to a toggle state before the data DATA is output. Accordingly, the data strobe signal DQS that toggles based on the read enable signal nRE may be generated in the nonvolatile memory 300. The controller interface circuit 210 may receive the data signal DQ including the data DATA from the nonvolatile memory 300, together with the toggling data strobe signal DQS. The controller interface circuit 210 may obtain the data DATA from the data signal DQ based on the toggle timing of the data strobe signal DQS.

In a data input operation of the nonvolatile memory 300, the controller interface circuit 210 may generate the data strobe signal DQS that toggles. For example, the controller interface circuit 210 may generate the data strobe signal DQS that changes from a static state (e.g., a high level or a low level) to a toggle state before transmitting the data DATA. The controller interface circuit 210 may transmit the data signal DQ including the data DATA to the nonvolatile memory 300 based on the toggle timings of the data strobe signal DQS.

Figure 5:
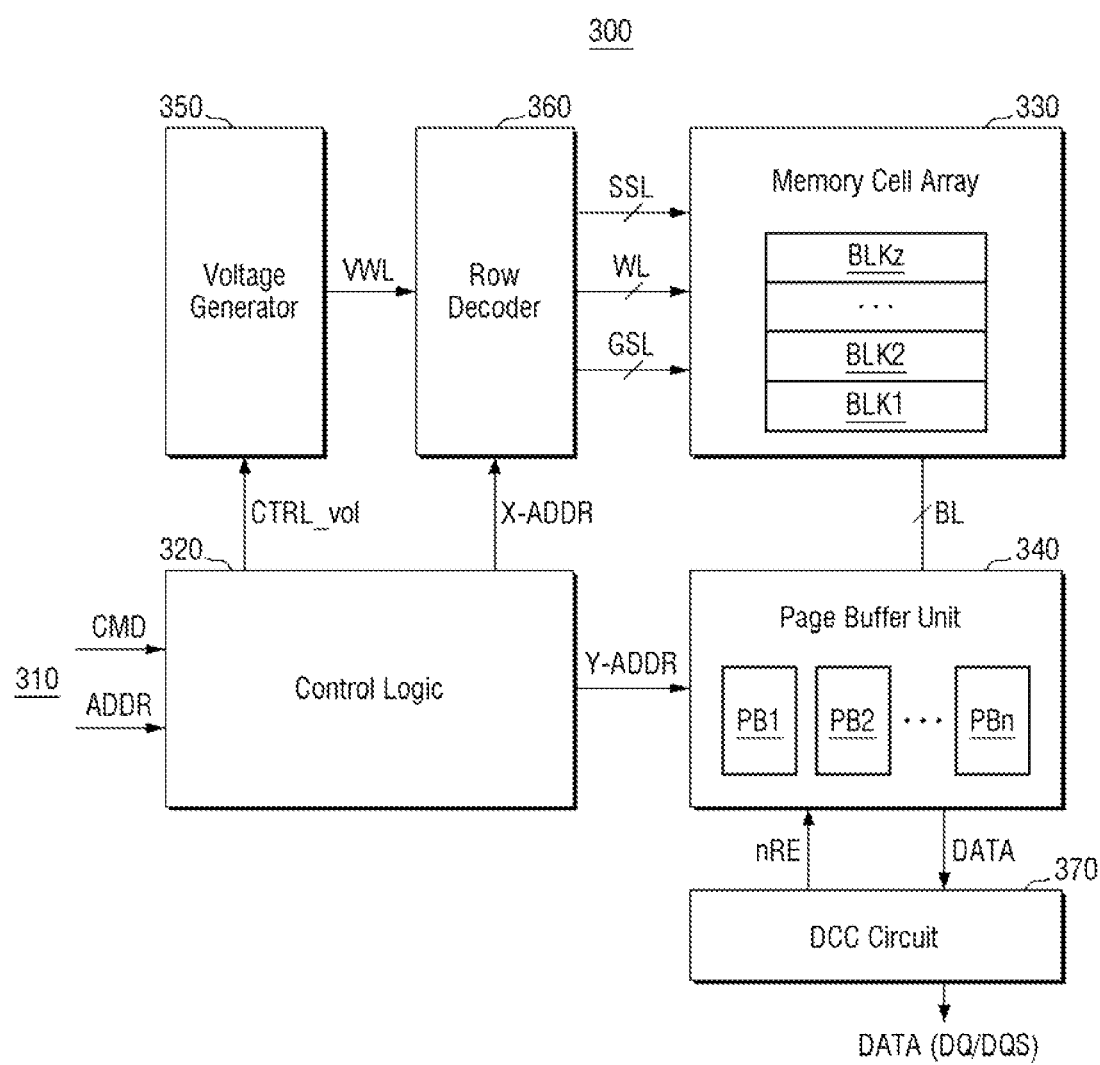
FIG. 5 illustrates a nonvolatile memory of FIG. 4.

FIG. 5 illustrates the nonvolatile memory 300 of FIG. 4. FIG. 5 is an example block diagram of the nonvolatile memory 300 of FIG. 4.

Referring to FIG. 5, the nonvolatile memory 300 may include the control logic circuit 320, the memory cell array 330, a page buffer unit 340, a voltage generator 350, a row decoder 360, and a duty cycle corrector circuit 370. Although not illustrated in FIG. 5, the nonvolatile memory 300 may further include the memory interface circuit 310 illustrated in FIG. 4 and may further include a column logic, a pre-decoder, a temperature sensor, a command decoder, an address decoder, and the like.

The control logic circuit 320 may generally control various operations in the nonvolatile memory 300. The control logic circuit 320 may output various control signals in response to the command CMD and/or the address ADDR from the memory interface circuit 310. For example, the control logic circuit 320 may output a voltage control signal CTRL vol, a row address X-ADDR, and a column address Y-ADDR.

The memory cell array 330 may include a plurality of memory blocks BLK1 through BLKz (where z is a positive integer), and each of the memory blocks BLK1 through BLKz may include a plurality of memory cells. The memory cell array 330 may be connected to the page buffer unit 340 through bit lines BL, and may be connected to the row decoder 360 through word lines WL, string select lines SSL, and ground select lines GSL.

In an example embodiment, the memory cell array 330 may include a 3D memory cell array, and the 3D memory cell array may include a plurality of NAND strings. Each of the NAND strings may include memory cells respectively connected to word lines stacked vertically on a substrate. U.S. Pat. Nos. 7,679,133, 8,553,466, 8,654,587, 8,559,235, and U.S. Patent Application Publication No. 2011/0233648 are incorporated herein by reference. In an example embodiment, the memory cell array 330 may include a 2D memory cell array, and the 2D memory cell array may include a plurality of NAND strings disposed along row and column directions.

The page buffer unit 340 may include a plurality of page buffers PB1 through PBn (where n is an integer of 3 or more), and the page buffers PB1 through PBn may be connected to the memory cells through the bit lines BL, respectively. The page buffer unit 340 may select at least one of the bit lines BL in response to the column address Y-ADDR. The page buffer unit 340 may operate as a write driver or a sense amplifier according to an operating mode. For example, during a program operation, the page buffer unit 340 may apply a bit line voltage corresponding to data to be programmed to a selected bit line. During a read operation, the page buffer unit 340 may sense data stored in a memory cell by sensing a current or voltage of a selected bit line.

The voltage generator 350 may generate various voltages for performing program, read, and erase operations based on the voltage control signal CTRL_vol. For example, the voltage generator 350 may generate a program voltage, a read voltage, a program verify voltage, an erase voltage, or the like as a word line voltage VWL.

The row decoder 360 may select one of the word lines WL and select one of the string select lines SSL in response to the row address X-ADDR. For example, during a program operation, the row decoder 360 may apply a program voltage and a program verify voltage to a selected word line. During a read operation, the row decoder 360 may receive the read enable signal nRE and provide the data signal DQ and the data strobe signal DQS to the duty cycle corrector circuit 370 by applying a read voltage to a selected word line.

The duty cycle corrector circuit 370 may provide the received data signal DQ and data strobe signal DQS to the memory interface circuit 310. The duty cycle corrector circuit 370 is described in detail below.

Figure 6:
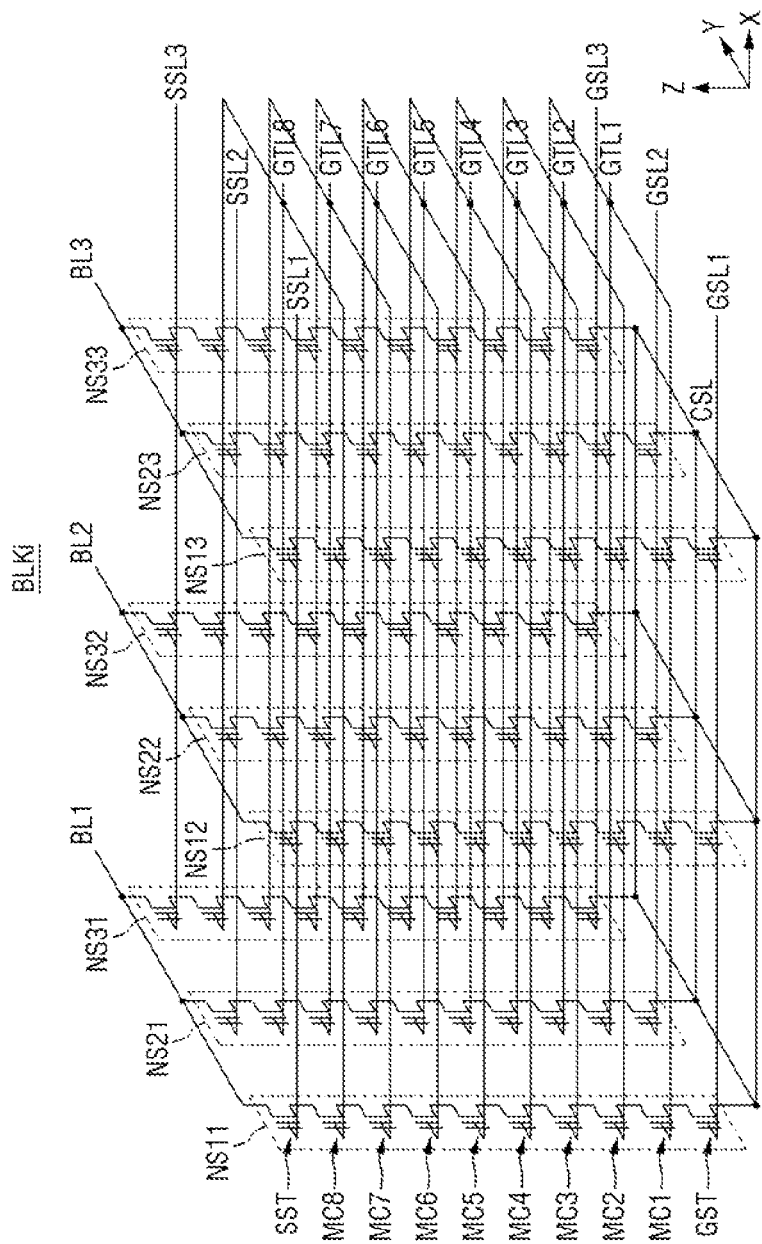
FIG. 6 illustrates a 3D V-NAND structure that can be included in a nonvolatile memory according to example embodiments.

FIG. 6 illustrates a 3D V-NAND structure that can be included in the nonvolatile memory 300 according to example embodiments. When the nonvolatile memory 300 according to example embodiments is implemented as a 3D V-NAND type flash memory, each of the memory blocks constituting the memory cell array 330 may be expressed as an equivalent circuit as illustrated in FIG. 6.

A memory block BLKi illustrated in FIG. 6 is a 3D memory block formed in a 3D structure on a substrate. For example, a plurality of memory NAND strings included in the memory block BLKi may be formed in a direction perpendicular to the substrate.

Referring to FIG. 6, the memory block BLKi may include a plurality of memory NAND strings NS11 through NS33 connected between bit lines BL1 through BL3 and a common source line CSL. Each of the memory NAND strings NS11 through NS33 may include a string select transistor SST, a plurality of memory cells MC1 through MC8, and a ground select transistor GST. Although each of the memory NAND strings NS11 through NS33 includes eight memory cells MC1 through MC8 in FIG. 6, example embodiments are not limited thereto.

The string select transistor SST may be connected to a corresponding string select line SSL1, SSL2, or SSL3. The memory cells MC1 through MC8 may be connected to corresponding gate lines GTL1 through GTL8, respectively. The gate lines GTL1 through GTL8 may be word lines, and some of the gate lines GTL1 through GTL8 may be dummy word lines. The ground select transistor GST may be connected to a corresponding ground select line GSL1, GSL2, or GSL3. The string select transistor SST may be connected to a corresponding bit line BL1, BL2, or BL3, and the ground select transistor GST may be connected to the common source line CSL.

A word line (e.g., WL1) at the same height may be connected in common, and the ground select lines GSL1 through GSL3 and the string select lines SSL1 through SL3 may be separated from each other. Although the memory block BLKi is connected to eight gate lines GTL1 through GTL8 and three bit lines BL1 through BL3 in FIG. 6, example embodiments are not limited thereto.

Figure 7:
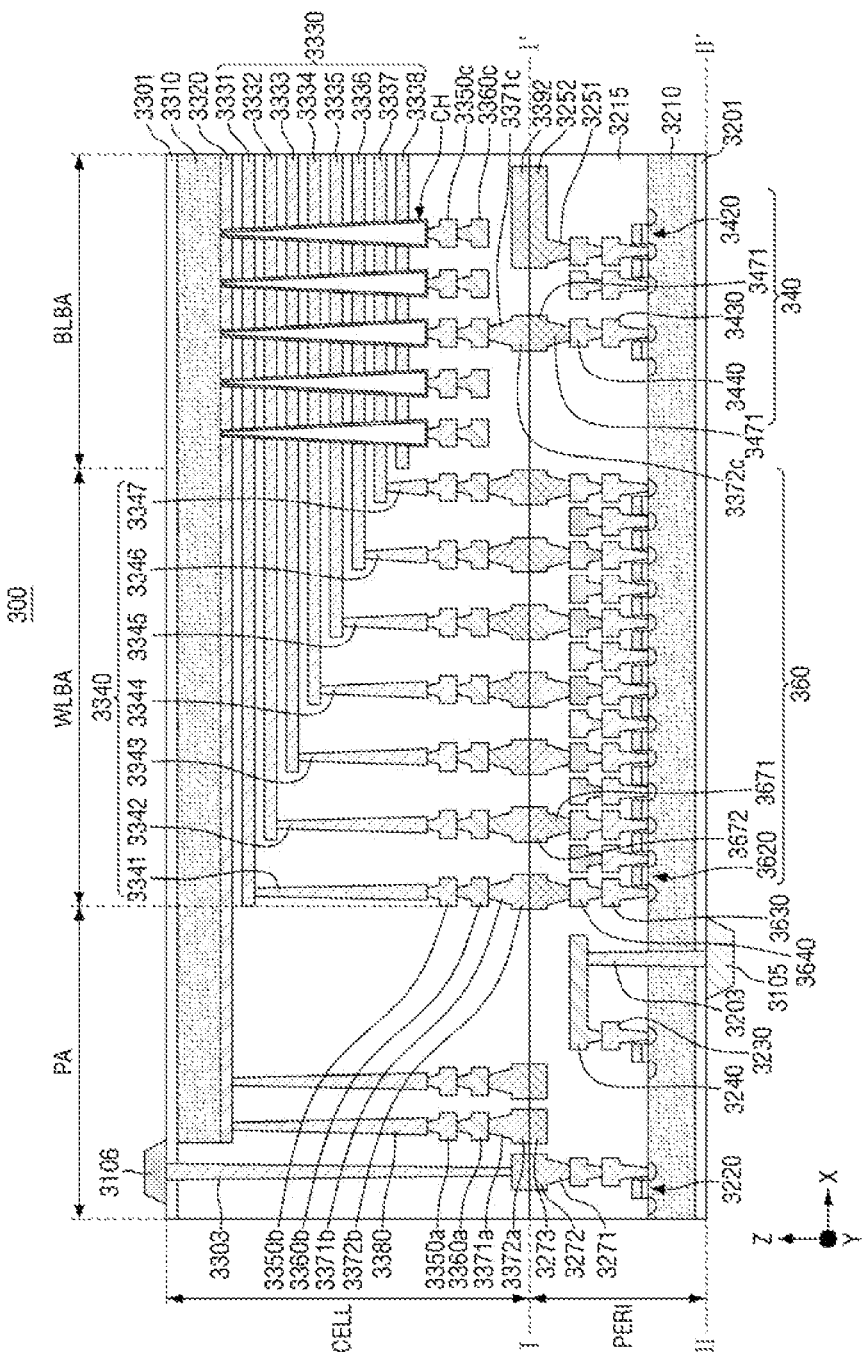
FIG. 7 illustrates a BVNAND structure applicable to the nonvolatile memory according to example embodiments.

FIG. 7 illustrates a BVNAND (Bonding-Vertical NAND) structure applicable to the nonvolatile memory 300 according to example embodiments.

Referring to FIG. 7, the nonvolatile memory 300 may have a chip-to-chip (C2C) structure. The C2C structure may be formed by manufacturing an upper chip including a cell area CELL on a first wafer, manufacturing a lower chip including a peripheral circuit area PERI on a second wafer different from the first wafer, and then connecting the upper chip and the lower chip using a bonding method. For example, the bonding method may refer to a method of electrically connecting a bonding metal formed on an uppermost metal layer of the upper chip and a bonding metal formed on an uppermost metal layer of the lower chip. For example, when the bonding metals are made of copper (Cu), the bonding method may be a Cu-Cu bonding method. The bonding metals may also be made of aluminum or tungsten.

Each of the periphery circuit area PERI and the cell area CELL of the nonvolatile memory 300 may include an external pad bonding area PA, a word line bonding area WLBA, and a bit line bonding area BLBA.

The peripheral circuit area PERI may include a first substrate 3210, an interlayer insulating layer 3215, a plurality of circuit elements 3220, 3620, and 3420 formed on the first substrate 3210, first metal layers 3230, 3630, and 3430 respectively connected to the circuit elements 3220, 3620, and 3420, and second metal layers 3240, 3640, and 3440 formed on the first metal layers 3230, 3630, and 3430. In an example embodiment, the first metal layers 3230, 3630, and 3430 may be made of tungsten having a relatively high resistance, and the second metal layers 3240, 3640, and 3440 may be made of copper having a relatively low resistance.

Although only the first metal layers 3230, 3630, and 3430 and the second metal layers 3240, 3640, and 3440 are illustrated and described herein, example embodiments are not limited thereto, and one or more metal layers may also be further formed on the second metal layers 3240, 3640, and 3440. At least some of the metal layers formed on the second metal layers 3240, 3640, and 3440 may be made of aluminum having a lower resistance than copper that forms the second metal layers 3240, 3640, and 3440.

The interlayer insulating layer 3215 may be disposed on the first substrate 3210 to cover the circuit elements 3220, 3620, and 3420, the first metal layers 3230, 3630, and 3430 and the second metal layers 3240, 3640, and 3440, and may include an insulating material such as silicon oxide or silicon nitride.

Lower bonding metals 3671 and 3672 may be formed on the second metal layers 3640 of the word line bonding area WLBA. In the word line bonding area WLBA, the lower bonding metals 3671 and 3672 of the peripheral circuit area PERI may be electrically connected to upper bonding metals 3371b and 3372b of the cell area CELL by a bonding method, and the lower bonding metals 3671 and 3672 and the upper bonding metals 3371b and 3372b may be made of aluminum, copper, or tungsten.

The cell area CELL may provide at least one memory block. The cell area CELL may include a second substrate 3310 and a common source line 3320. A plurality of word lines 3331 through 3338 (collectively, 3330) may be stacked on the second substrate 3310 along a third direction (Z-axis direction) that is perpendicular to an upper surface of the second substrate 3310. String select lines and a ground select line may be disposed on and under the word lines 3330, respectively, and the word lines 3330 may be disposed between the string select lines and the ground select line.

In the bit line bonding area BLBA, channel structures CH may extend in the direction perpendicular to the upper surface of the second substrate 3310 to penetrate the word lines 3330, the string select lines, and the ground select line. Each of the channel structures CH may include a data storage layer, a channel layer, and a buried insulating layer. The channel layer may be electrically connected to a first metal layer 3350c and a second metal layer 3360c. For example, the first metal layer 3350c may be a bit line contact, and the second metal layer 3360c may be a bit line. In an example embodiment, the bit line 3360c may extend along a first direction (Y-axis direction) that is parallel to the upper surface of the second substrate 3310.

In the embodiment illustrated in FIG. 7, an area where the channel structures CH and the bit lines 3360c are disposed may be defined as the bit line bonding area BLBA. In the bit line bonding area BLBA, one of the bit lines 3360c may be electrically connected to the circuit elements 3420 which provide a page buffer PB (see 340 in FIG. 5) in the peripheral circuit area PERI. For example, one of the bit lines 3360c may be connected to upper bonding metals 3371c and 3372c in the peripheral circuit area PERI, and the upper bonding metals 3371c and 3372c may be connected to lower bonding metals 3471 and 3472 connected to the circuit elements 3420 of the page buffer PB (see 340 in FIG. 5).

In the word line bonding area WLBA, the word lines 3330 may extend along a second direction (X-axis direction) that is parallel to the upper surface of the second substrate 3310, and may be connected to a plurality of cell contact plugs 3341 through 3347 (collectively, 3340). The word lines 3330 and the cell contact plugs 3340 may be connected to each other by pads provided by at least some of the word lines 3330 which extend to different lengths along the second direction. First metal layers 3350b and second metal layers 3360b may be sequentially connected onto the cell contact plugs 3340 connected to the word lines 3330. In the word line bonding area WLBA, the cell contact plugs 3340 may be connected to the peripheral circuit area PERI through the upper bonding metals 3371b and 3372b of the cell area CELL and the lower bonding metals 3671 and 3672 of the peripheral circuit area PERI.

The cell contact plugs 3340 may be electrically connected to the circuit elements 3620 which provide a row decoder 360 in the peripheral circuit area PERI. In an example embodiment, an operating voltage of the circuit elements 3620 which provide the row decoder 360 may be different from an operating voltage of the circuit elements 3420 which provide the page buffer PB (see 340 in FIG. 5). For example, the operating voltage of the circuit elements 3420 which provide the page buffer PB (see 340 in FIG. 5) may be greater than the operating voltage of the circuit elements 3620 which provide the row decoder 360.

Common source line contact plugs 3380 may be disposed in the external pad bonding area PA. The common source line contact plugs 3380 may be made of a conductive material such as a metal, a metal compound, or polysilicon, and may be electrically connected to the common source line 3320. First metal layers 3350a and second metal layers 3360a may be sequentially stacked on the common source line contact plugs 3380. For example, an area where the common source line contact plugs 3380, the first metal layers 3350a, and the second metal layers 3360a are disposed may be defined as the external pad bonding area PA.

Input/output pads 3105 and 3106 may be disposed in the external pad bonding area PA. Referring to FIG. 7, a lower insulating layer 3201 may be formed under the first substrate 3210 to cover a lower surface of the first substrate 3210, and a first input/output pad 3105 may be formed on the lower insulating layer 3201. The first input/output pad 3105 may be connected to at least one of the circuit elements 3220, 3620, and 3420 disposed in the peripheral circuit area PERI through a first input/output contact plug 3203, and may be separated from the first substrate 3210 by the lower insulating layer 3201. In addition, a side insulating layer may be disposed between the first input/output contact plug 3203 and the first substrate 3210 to electrically separate the first input/output contact plug 3203 and the first substrate 3210.

Referring to FIG. 7, an upper insulating layer 3301 may be formed on the second substrate 3310 to cover the upper surface of the second substrate 3310, and a second input/output pad 3106 may be disposed on the upper insulating layer 3301. The second input/output pad 3106 may be connected to at least one of the circuit elements 3220, 3420, and 3620 disposed in the peripheral circuit area PERI through a second input/output contact plug 3303.

According to example embodiments, the second substrate 3310 and the common source line 3320 may not be disposed in an area where the second input/output contact plug 3303 is disposed. The second input/output pad 3106 may not overlap the word lines 3330 in the third direction (Z-axis direction). Referring to FIG. 7, the second input/output contact plug 3303 may be separated from the second substrate 3310 in a direction parallel to the upper surface of the second substrate 3310, e.g., in the second or X direction in FIG. 7, and may penetrate the interlayer insulating layer 3215 of the cell area CELL and be connected to the second input/output pad 3106.

According to example embodiments, the first input/output pad 3105 and the second input/output pad 3106 may be selectively formed. For example, the nonvolatile memory 300 may include only the first input/output pad 3105 disposed on the first substrate 3210 or may include only the second input/output pad 3106 disposed on the second substrate 3310. Alternatively, the nonvolatile memory 300 may include both the first input/output pad 3105 and the second input/output pad 3106.

In each of the external pad bonding area PA and the bit line bonding area BLBA included in each of the cell area CELL and the peripheral circuit area PERI, a metal pattern of an uppermost metal layer may exist as a dummy pattern, or the upper metal layer may be empty.

In the external pad bonding area PA of the nonvolatile memory 300, lower metal patterns 3273 having the same shape as upper metal patterns 3372a of the cell area CELL may be formed in an uppermost metal layer of the peripheral circuit area PERI to correspond to the upper metal patterns 3372a formed in an uppermost metal layer of the cell area CELL. The lower metal patterns 3273 formed in the uppermost metal layer of the peripheral circuit area PERI may not be connected to separate contacts in the peripheral circuit area PERI. Similarly, in the external pad bonding area PA, upper metal patterns having the same shape as lower metal patterns of the peripheral circuit area PERI may be formed in the uppermost metal layer of the cell area CELL to correspond to the lower metal patterns formed in the uppermost metal layer of the peripheral circuit area PERI.

The lower bonding metals 3671 and 3672 may be formed on the second metal layers 3640 of the word line bonding area WLBA. In the word line bonding area WLBA, the lower bonding metals 3671 and 3672 of the peripheral circuit area PERI may be electrically connected to the upper bonding metals 3371b and 3372b of the cell area CELL by a bonding method.

In the bit line bonding area BLBA, an upper metal pattern 3392 having the same shape as a lower metal pattern 3252 of the peripheral circuit area PERI may be formed in the uppermost metal layer of the cell area CELL to correspond to the lower metal pattern 3252 formed in the uppermost metal layer of the peripheral circuit area PERI. A contact may not be formed on the upper metal pattern 3392 formed in the uppermost metal layer of the cell area CELL.

Figure 8:
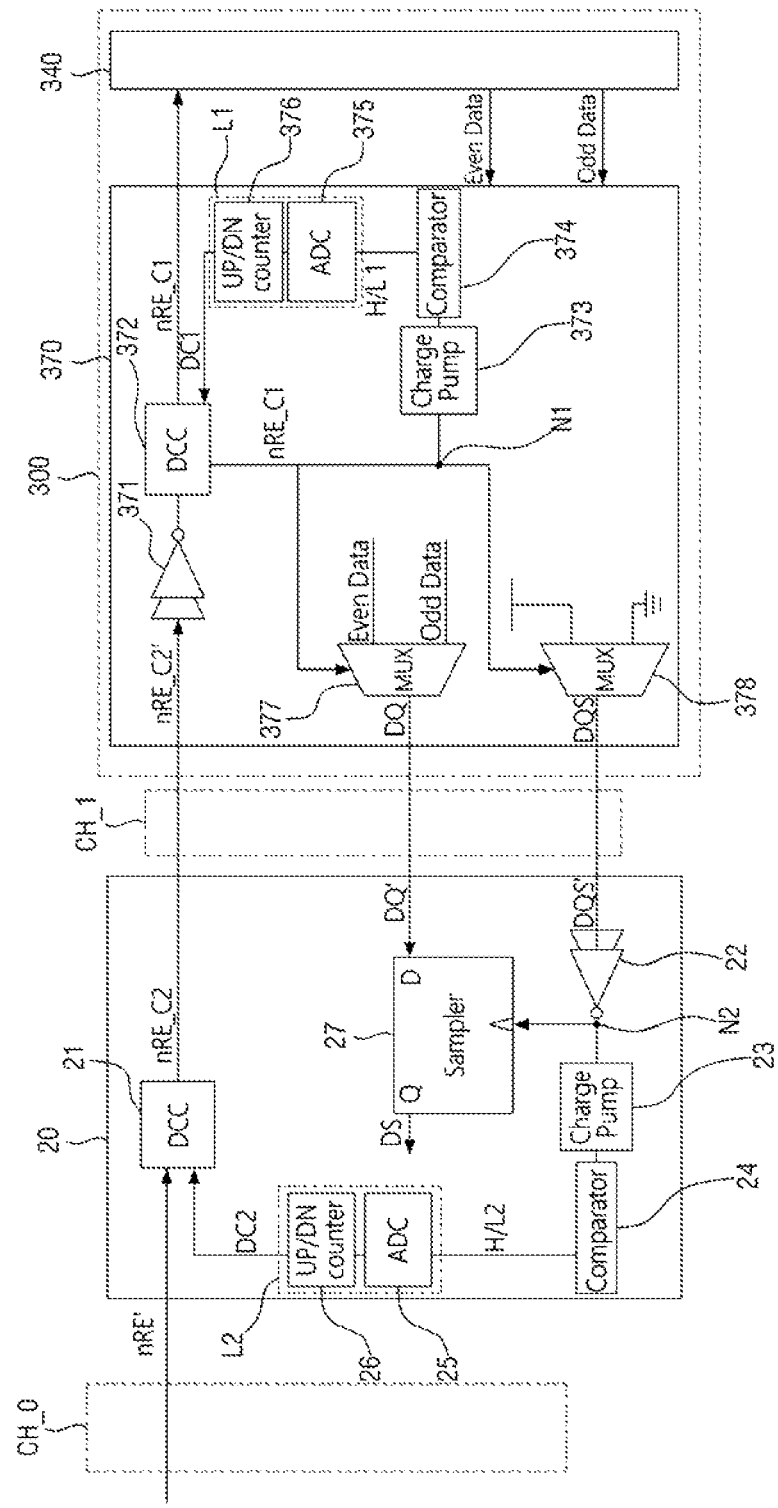
FIG. 8 illustrates the storage system according to example embodiments.

FIG. 8 illustrates the storage system according to example embodiments.

Referring to FIG. 8, in an example embodiment, the duty cycle corrector circuit 370 corresponding to the duty cycle corrector circuit 370 of FIG. 5 includes a first internal circuit 371, a first duty cycle corrector 372, a first charge pump 373, a first comparator 374, a first logic L1, a data signal generator 377, and a data strobe signal generator 378.

The buffer 20 may provide a read enable signal nRE_C2 to the first internal circuit 371. Through the read enable signal nRE_C2 of the buffer 20, the first internal circuit 371 receives a read enable signal nRE_C2' with a distorted duty through a first channel CH_1. The duty-distorted read enable signal nRE_C2' may be generated as the read enable signal nRE_C2 is affected by the first channel CH_1 due to a high frequency (e.g., 2.4 GHz) of the read enable signal nRE_C2 and a length of the first channel CH_1.

The first internal circuit 371 may receive the read enable signal nRE_C2' and generate an internal read enable signal based on the received read enable signal nRE_C2'. In an example embodiment, the first internal circuit 371 may include a plurality of inverters. When the duty of the read enable signal nRE_C2' is distorted, a duty of the internal read enable signal may also be distorted. Even when the duty of the read enable signal nRE_C2' is not distorted, the duty of the internal read enable signal may be distorted as the internal read enable signal passes through the first internal circuit 371.

The first duty cycle corrector 372 may receive a first digital code DC1 from a first up/down counter 376 and generate a first corrected read enable signal nRE_C1 by performing a duty correction operation on the internal read enable signal based on the first digital code DC1. The generated first corrected read enable signal nRE_C1 may be provided to the page buffer unit 340 and used for a read operation of the nonvolatile memory 300. The first corrected read enable signal nRE_C1 may be provided to the first charge pump 373, the data signal generator 377, and the data strobe signal generator 378.

The first duty cycle corrector 372 may remove the duty distortion of the internal read enable signal. Accordingly, a duty ratio of the first corrected read enable signal nRE_C1 may be 1:1. According to an example embodiment, the first duty cycle corrector 372 may have various components for performing a duty correction operation. The configuration and operation of the first duty cycle corrector 372 described herein are an example, and example embodiments are not limited thereto.

Figure 12:
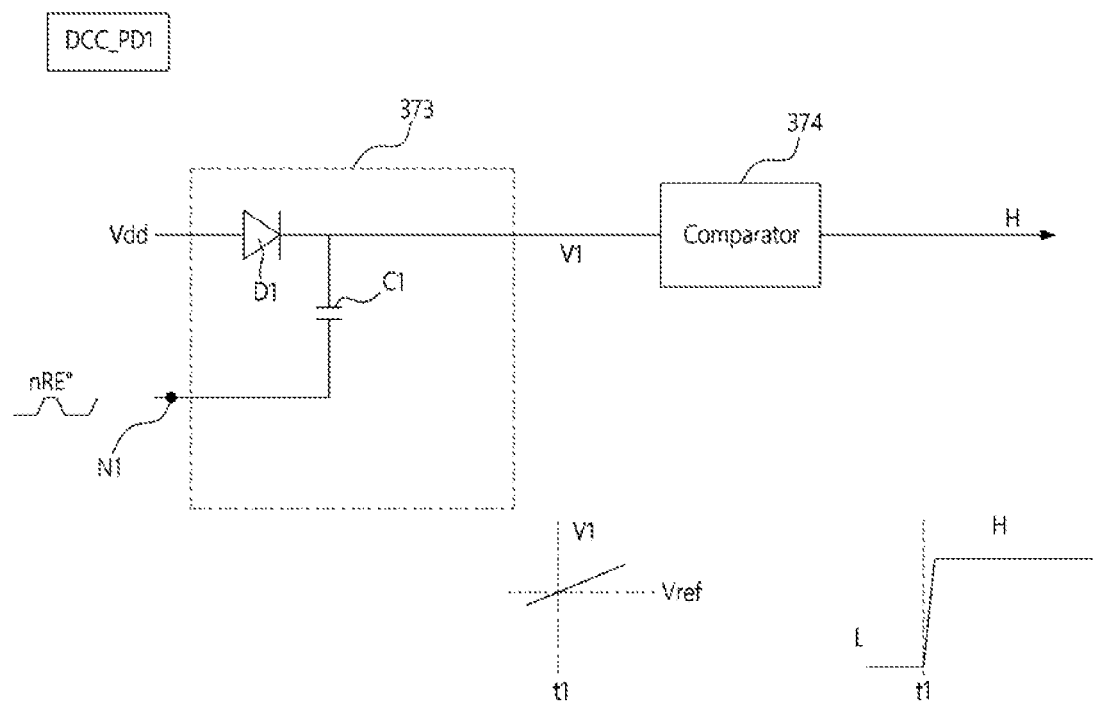

The first charge pump 373 charges electric charges by receiving the first corrected read enable signal nRE_C1 output to a first node N1, and outputs a first voltage V1 (see FIG. 12). The magnitude of the first voltage V1 (see FIG. 12) output from the first charge pump 373 varies according to the duty ratio of the first corrected read enable signal nRE_C1. Thus, the duty ratio of the first corrected read enable signal nRE_C1, which is an output signal of the first duty cycle corrector 372, is sensed to output the first voltage V1 (see FIG. 12).

The first comparator 374 senses the magnitude of the first voltage V1 (see FIG. 12) output from the first charge pump 373, and provides a first high/low signal H/L 1 to the first logic L1 according to the magnitude. The first comparator 374 senses the duty ratio of the first corrected read enable signal nRE_C1 through the first voltage V1 (see FIG. 12), and generates the first high/low signal H/L 1.

The first logic L1 includes a first analog-to-digital converter (ADC) 375 and the first up/down counter 376. The first logic L1 may provide the first data code DC1 regarding the duty ratio of the first corrected read enable signal nRE_C1 to the first duty cycle corrector 372, thereby forming one loop of the first duty cycle corrector 372, the first charge pump 373, the first comparator 374, and the first logic L1.

The first ADC 375 receives the first high/low signal H/L 1 and converts the first high/low signal H/L 1, which is an analog signal, into digital data.

The first up/down counter 376 may generate the first digital code DC1 from the first high/low signal H/L 1 converted into digital data. For example, the first digital code DC1 may be generated as a 4-bit digital code. The first digital code DC1 may be increased by one when the first high/low signal H/L 1 converted into digital data is logic high, and may be reduced by one when the first high/low signal H/L 1 converted into digital data is logic low.

The first duty cycle corrector 372 may perform a duty correction operation on the read enable signal nRE_C2' based on the first data code DC1 output from the first logic L1, and may generate the read enable signal nRE_C2' as the first corrected read enable signal nRE_C1.

The data signal generator 377 receives odd data and even data from the page buffer unit 340, receives the first corrected read enable signal nRE_C1, and generates the data signal DQ. For example, the data signal generator 377 may include, but is not limited to, a multiplexer.

The data signal generator 377 generates the data signal DQ by selecting the odd data or the even data based on the first corrected read enable signal nRE_C1. The data signal DQ generated by the data signal generator 377 may be provided to the buffer 20 through the first channel CH_1.

The data strobe signal generator 378 receives the first corrected read enable signal nRE_C1, and generates the data strobe signal DQS. For example, the data strobe signal generator 378 may include, but is not limited to, a multiplexer.

The data strobe signal generator 378 may have an end connected to a ground terminal and another end connected to a power supply voltage, and may generate the data strobe signal DQS, which is a toggling signal, in response to the first corrected read enable signal nRE_C1. The data strobe signal DQS generated by the data strobe signal generator 378 may be provided to the buffer 20 through the first channel CH_1.

In an example embodiment, the buffer 20 corresponding to the buffer 20 of FIG. 4 includes a second duty cycle corrector 21, a second internal circuit 22, a second charge pump 23, a second comparator 24, a second logic L2, and a sampler 27.

The second internal circuit 22, the second duty cycle corrector 21, the second charge pump 23, the second comparator 24, and the second logic L2 correspond to the first internal circuit 371, the first duty cycle corrector 372, the first charge pump 373, the first comparator 374, and the first logic L1 of the duty cycle corrector circuit 370, respectively. Thus, only differences between them will be described, and a detailed description of each component will be omitted.

The second internal circuit 22 may receive a data strobe signal DQS' whose duty is distorted as it passes through the first channel CH_1, and may provide the data strobe signal DQS' to the sampler 27 and the second charge pump 23 in the form of an internal data strobe signal.

The second charge pump 23 senses a duty ratio of the data strobe signal DQS', and outputs a second voltage (not illustrated) according to the duty ratio of the internal data strobe signal. The second comparator 24 senses the magnitude of the second voltage (not illustrated), and provides a second high/low signal H/L 2 to the second logic L2 according to the magnitude. The second comparator 24 senses the duty ratio of the data strobe signal DQS' through the second voltage (not illustrated), and generates the second high/low signal H/L 2.

The second logic L2 generates a second data code DC2 including information about the duty ratio of the data strobe signal DQS' based on the second high/low signal H/L 2, and provides the second data code DC2 to the second duty cycle corrector 21.

The second duty cycle corrector 21 generates a second corrected read enable signal nRE_C2 by performing a second duty correction operation on a read enable signal nRE', which is received through a zero[th] channel CH_0, based on the second data code DC2, and provides the second corrected read enable signal nRE_C2 to the duty cycle corrector circuit 370 as a read enable signal.

Therefore, one loop of the second charge pump 23, the second comparator 24, the second logic L2, the second duty cycle corrector 21, and the nonvolatile memory 300 may be formed. The duty cycle corrector circuit 370 may receive the read enable signal nRE_C2' again through the first channel CH_1 and perform the above series of operations again.

Therefore, the duty ratio of the data strobe signal DQS' may be corrected by the second duty correction operation of the second duty cycle corrector 21.

The sampler 27 may include, but is not limited to, a plurality of flip-flops.

The sampler 27 may receive a data signal DQ' and the data strobe signal DQS', in which duty distortion has occurred, through the first channel CH_1. The sampler 27 may sample the data signal DQ' using the data strobe signal DQS', and may form a data stream synchronized with the data strobe signal DQS' through sampling. Thus, the sampler 27 may generate a data stream DS by sampling the data signal DQ' at each of a rising edge and a falling edge of the data strobe signal DQS'.

Although not illustrated, the buffer 20 may newly generate the data signal DQ and the data strobe signal DQS through the data stream DS and the data strobe signal DQS', and provide the data signal DQ and the data strobe signal DQS to the memory controller 200 (see FIG. 4).

FIGS. 9 through 16 are diagrams for explaining the operation of the storage system according to example embodiments.

Figure 9:
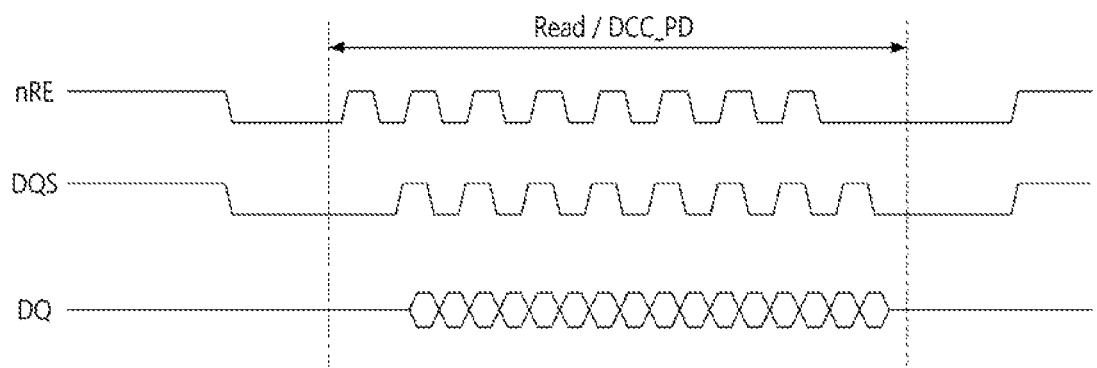
FIGS. 9 through 16 are diagrams for explaining the operation of the storage system according to example embodiments.

Referring to FIGS. 8 and 9, the memory controller 200 may provide the read enable signal nRE to the buffer 20 through the zero$^{th}$ channel CH_0. The read enable signal nRE may be provided to the buffer 20 as the read enable signal nRE' with a distorted duty through the zero$^{th}$ channel CH_0.

The read enable signal nRE may toggle at a predetermined frequency (e.g., 2.4 GHz) during a DCC training period or a read operation (Read/DCC PD), and the buffer 20 and the memory controller 200 may receive the read enable signal nRE as a clock signal.

The nonvolatile memory 300 may receive the read enable signal nRE, and then generate the data signal DQ and the data strobe signal DQS based on the read enable signal nRE after a delay of one cycle of the read enable signal nRE. The above degree of delay is only an example used in the generation of the data signal DQ and the data strobe signal DQS, and example embodiments are not limited thereto.

Figure 10:
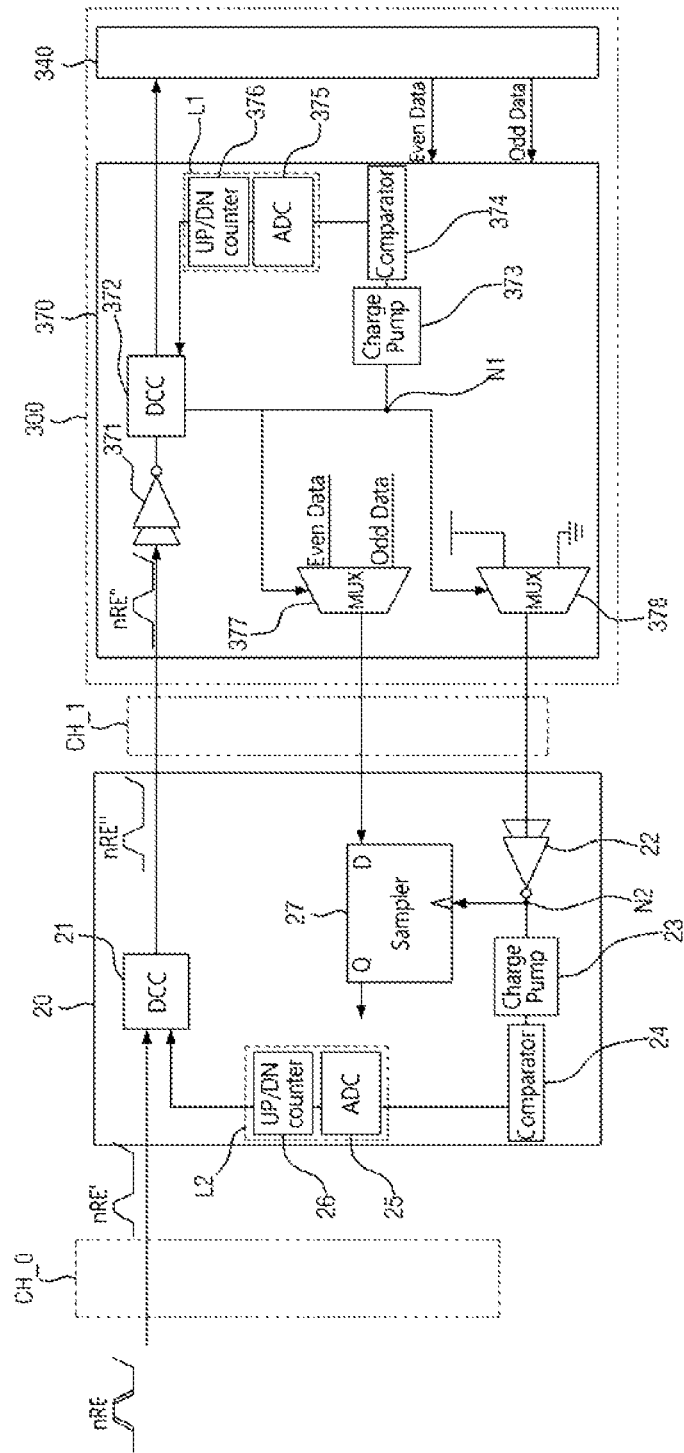

Referring to FIG. 10, the memory controller 200 provides the read enable signal nRE output from the memory controller 200 to the buffer 20 through the zero$^{th}$ channel CH_0, and the read enable signal nRE' provided through the zero$^{th}$ channel CH_0 has the distorted duty.

The duty of the read enable signal nRE' is distorted as the read enable signal nRE' passes through the buffer 20 and the first channel CH_1, and a duty-distorted read enable signal nRE" is provided to the duty cycle corrector circuit 370.

Figure 11:
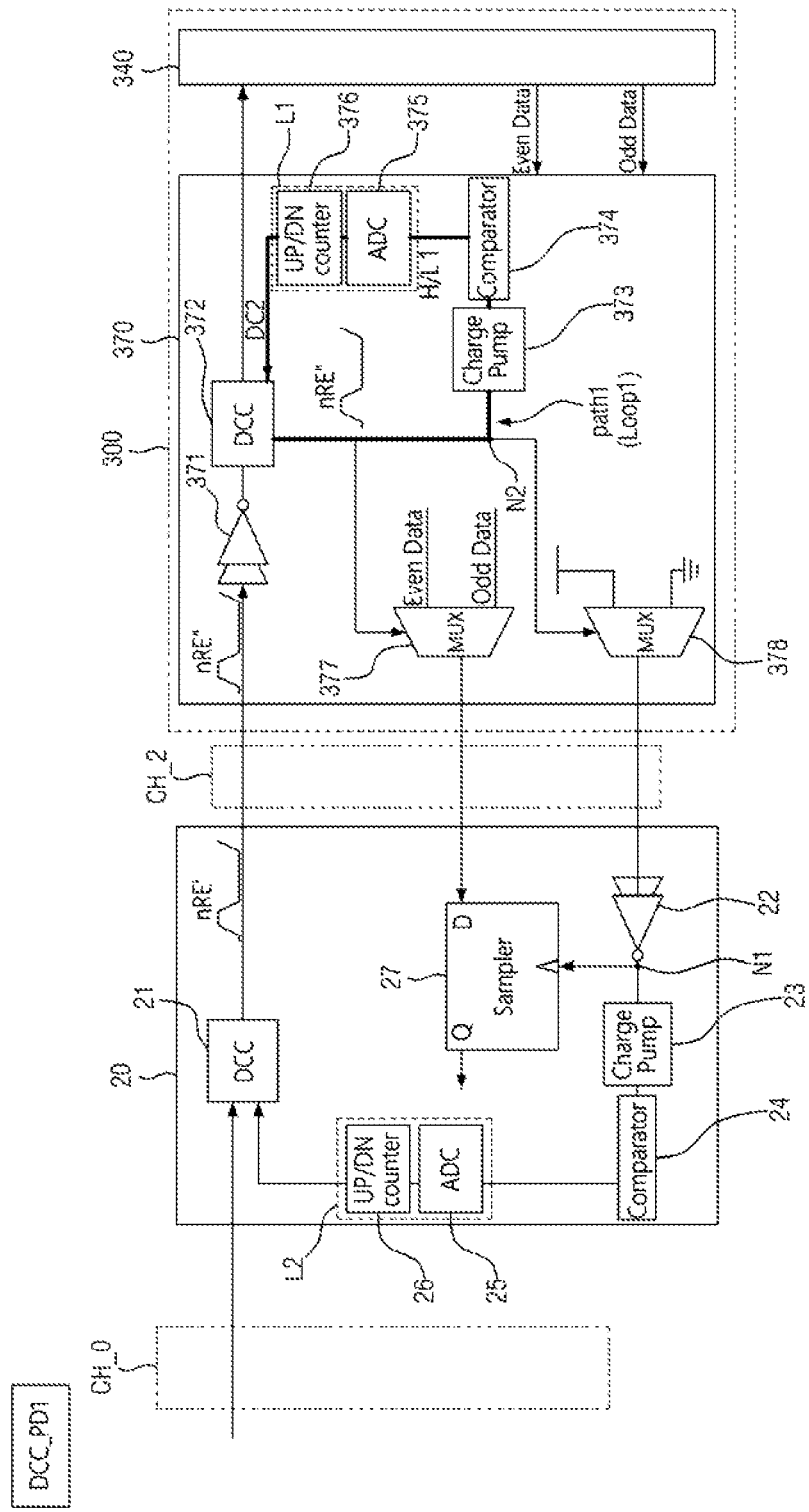

Referring additionally to FIG. 11, when the read enable signal nRE" is input to the first duty cycle corrector 372, the first duty cycle corrector 372 provides the read enable signal nRE" to the first charge pump 373 because it has not yet received a digital code from the first logic L1.

The first charge pump 373, the first comparator 374, the first logic L1 and the first duty cycle corrector 372 may form a first path (first loop) to perform a duty correction operation on the read enable signal nRE".

Referring additionally to FIG. 12, the first charge pump 373 may include a first diode D1 and a first capacitor C1. An end of the first diode D1 is connected to a power supply voltage Vdd.

An end of the first capacitor C1 may be connected to the first node N1 to receive the read enable signal nRE", and the other end of the first capacitor C1 may be connected to the other end of the first diode D1. The structure of FIG. 12 is an example of the first charge pump 373, and the structure of the first charge pump 373 does not limit example embodiments.

The first voltage V1 is formed at the other end of the first diode D1 and output to the first comparator 374.

When a duty ratio of the read enable signal nRE" is lower than 1:1, the first voltage V1 may be formed to be higher than a reference voltage Vref. Therefore, the first comparator 374 outputs a logic high signal after a first time t1.

Figure 13:
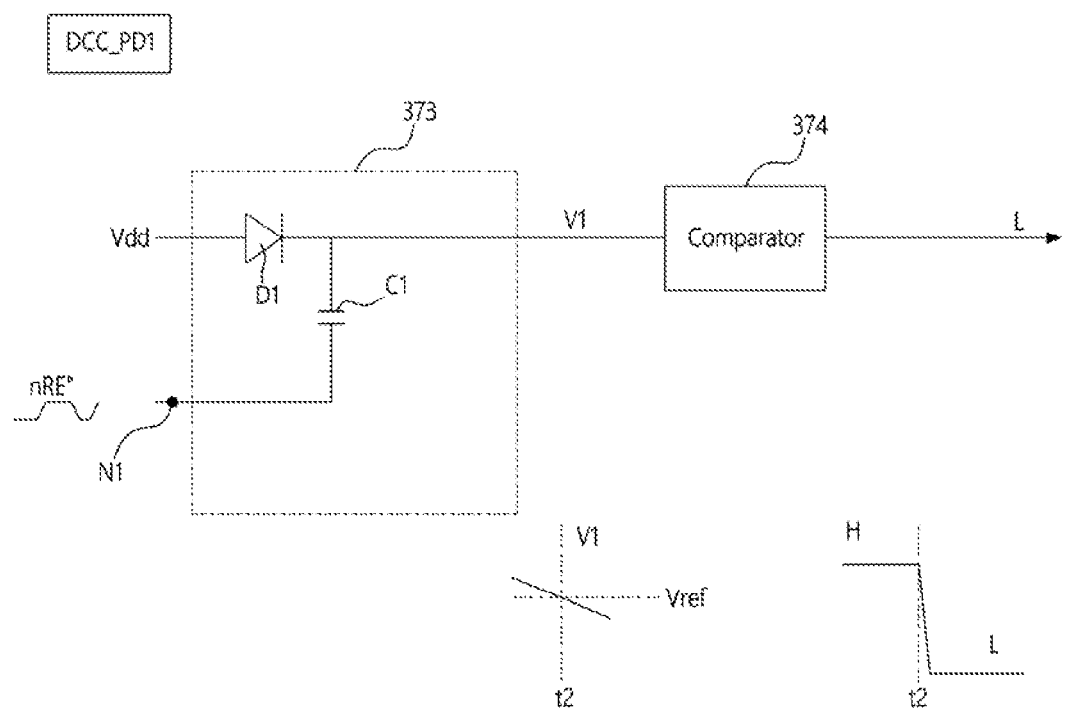

Referring additionally to FIG. 13, when the duty ratio of the read enable signal nRE" is higher than 1:1, the first voltage V1 may be formed to be lower than the reference voltage Vref. Therefore, the first comparator 374 outputs a logic low signal after a second time t2. The operations of the first charge pump 373 and the first comparator 374 of FIGS. 12 and 13 are examples and do not limit example embodiments.

Figure 14:
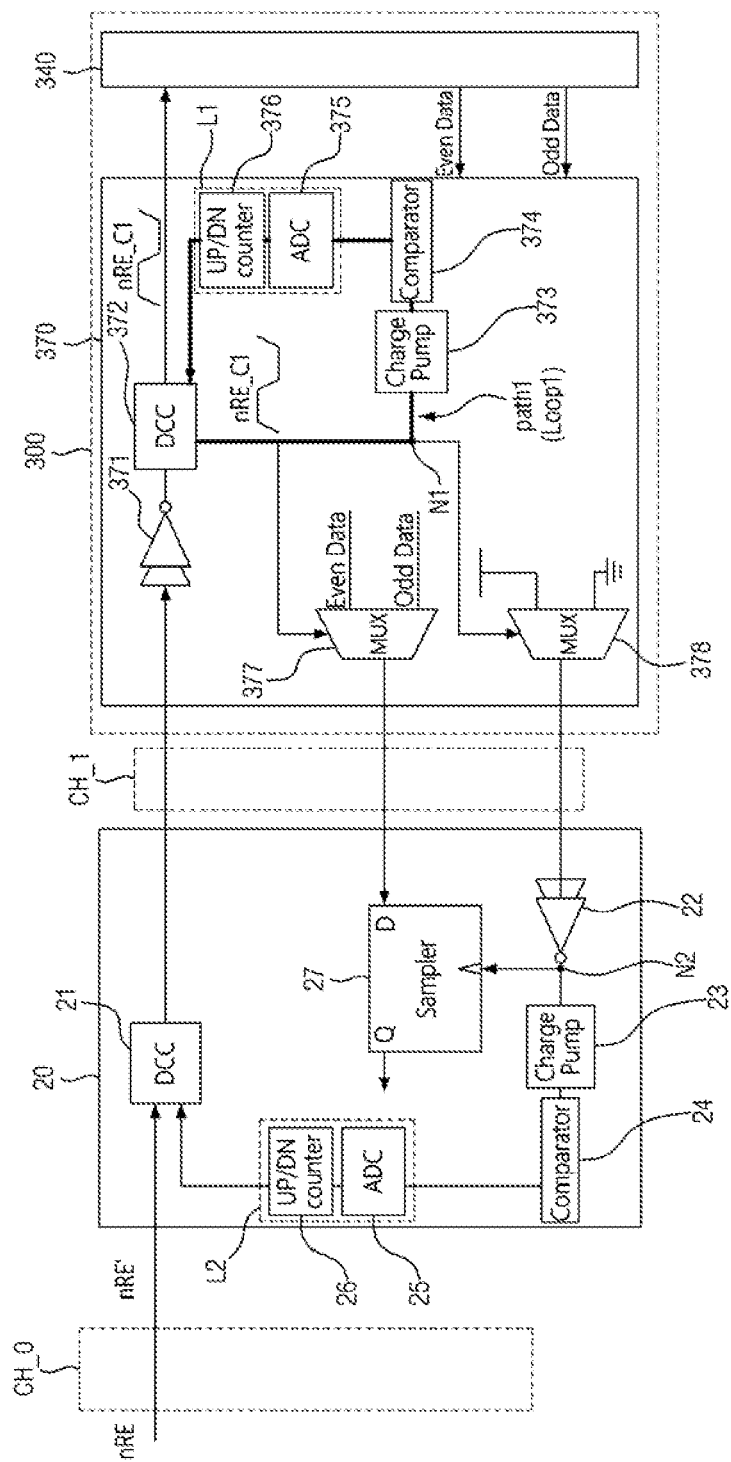

Referring additionally to FIG. 14, the first duty cycle corrector 372 may generate the first corrected read enable signal nRE_C1 by performing a duty correction operation on the read enable signal nRE" based on the first digital code DC1. The generated first corrected read enable signal nRE_C1 may be provided to the page buffer unit 340 and used for a read operation of the nonvolatile memory 300. The first corrected read enable signal nRE_C1 may be provided to the first charge pump 373, the data signal generator 377, and the data strobe signal generator 378.

Figure 15:
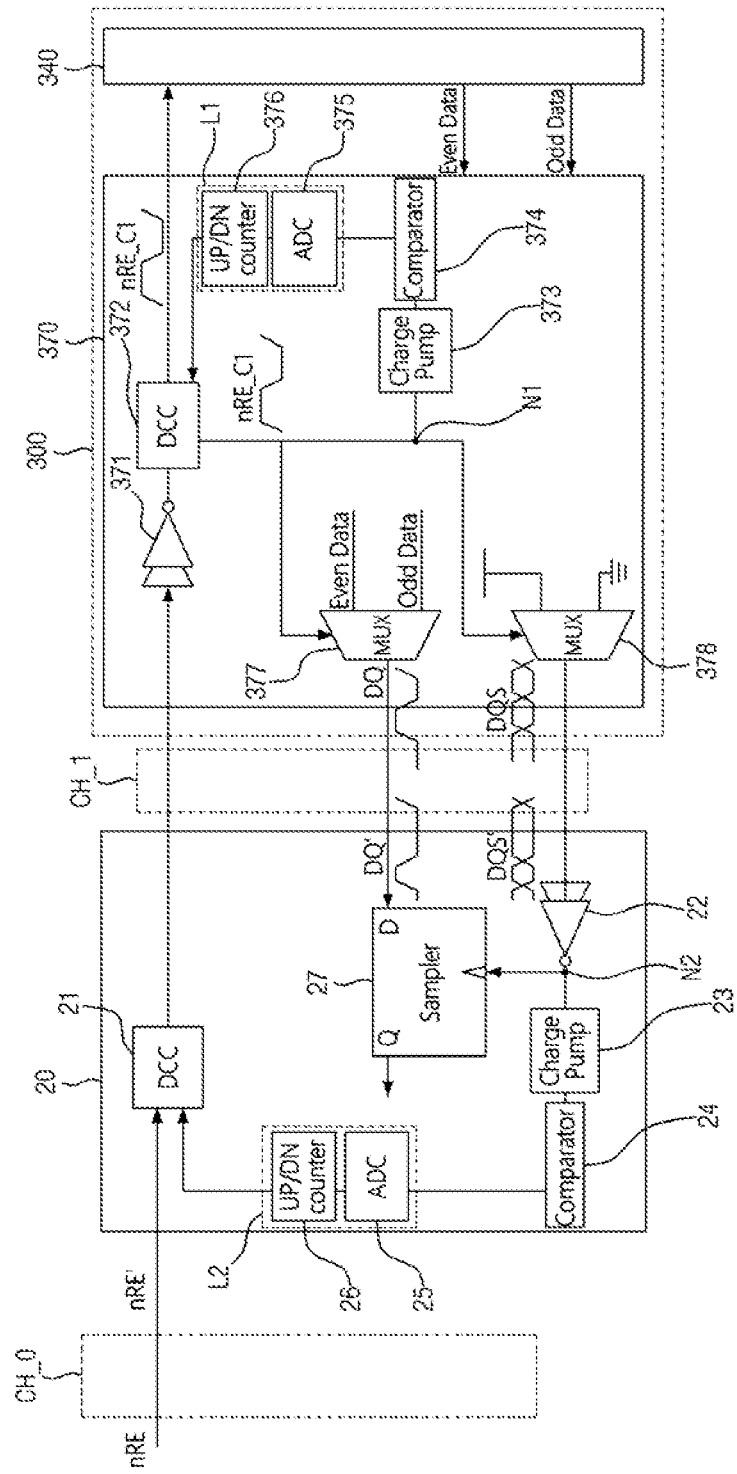

Referring to FIG. 15, the data signal generator 377 receives the odd data and the even data from the page buffer unit 340, receives and the first corrected read enable signal nRE_C1, and generates the data signal DQ.

The data signal generator 377 generates the data signal DQ by selecting the odd data or the even data based on the first corrected read enable signal nRE_C1. The data signal DQ generated by the data signal generator 377 may be provided to the buffer 20 through the first channel CH_1. The data signal DQ may be provided to the buffer 20 in the form of the data signal DQ' with a distorted duty through the first channel CH_1.

The data strobe signal generator 378 receives the first corrected read enable signal nRE_C1, and generates the data strobe signal DQS.

The data strobe signal generator 378 may have an end connected to a ground terminal and another end connected to a power supply voltage, and may generate the data strobe signal DQS, which is a toggling signal, in response to the first corrected read enable signal nRE_C1. The data strobe signal DQS generated by the data strobe signal generator 378 may be provided to the buffer 20 through the first channel CH_1. The data strobe signal DQS may be provided to the buffer 20 in the form of the data strobe signal DQ' with a distorted duty through the first channel CH_1.

Figure 16:
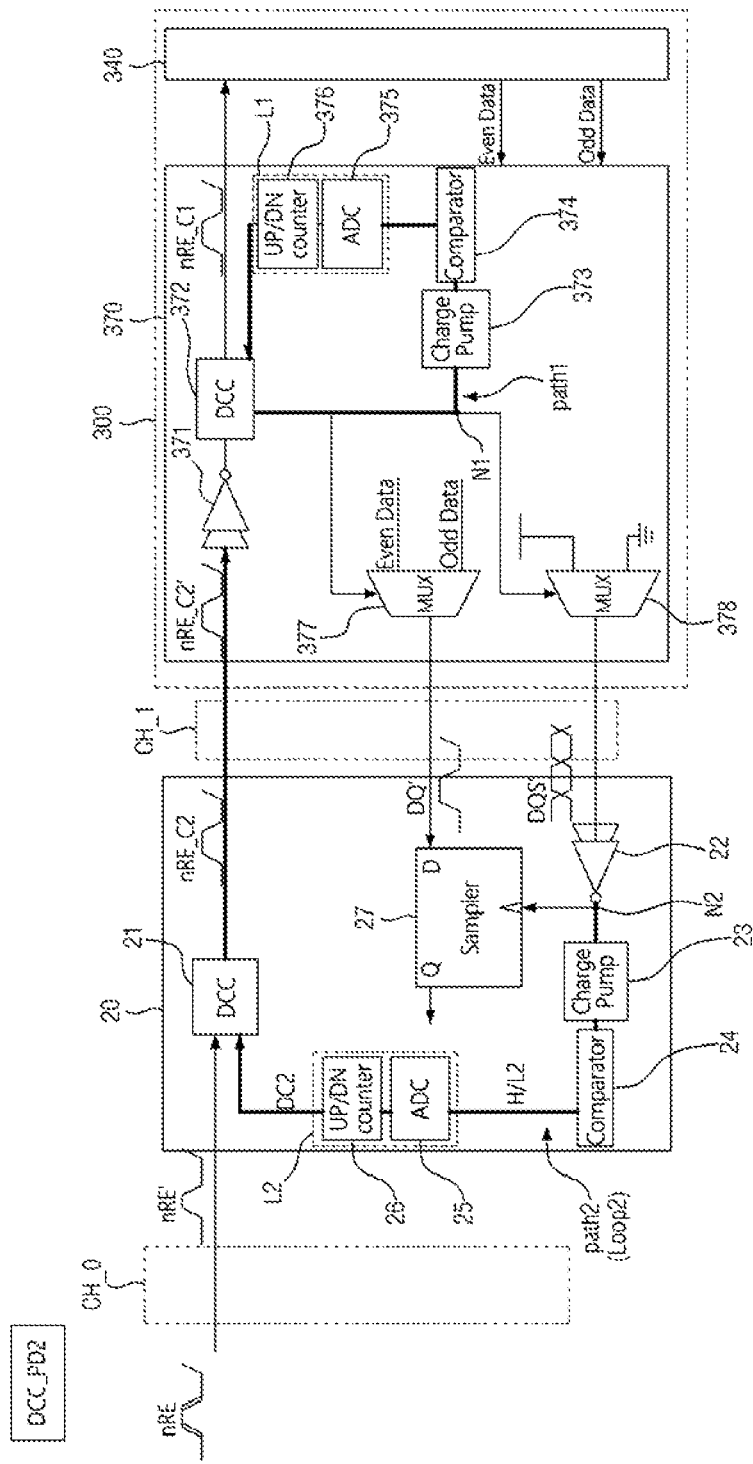

Referring to FIG. 16, the second charge pump 23, the second comparator 24, the second logic L2 and the second duty cycle corrector 21 may form a second path (second loop) to perform a duty correction operation on the data strobe signal DQS'.

The second duty cycle corrector 21 receives the second data code DC2 through the second logic L2, generates the second corrected read enable signal nRE_C2 by performing the second duty correction operation on the read enable signal nRE', which is received through the zero$^{th}$ channel CH_0, based on the second data code DC2, and provides the second corrected read enable signal nRE_C2 to the duty cycle corrector circuit 370 as a read enable signal.

A duty correction operation may be performed on the duty ratios of the data strobe signal DQS' and the data signal DQ' through the second corrected read enable signal nRE_C2.

Figure 17:
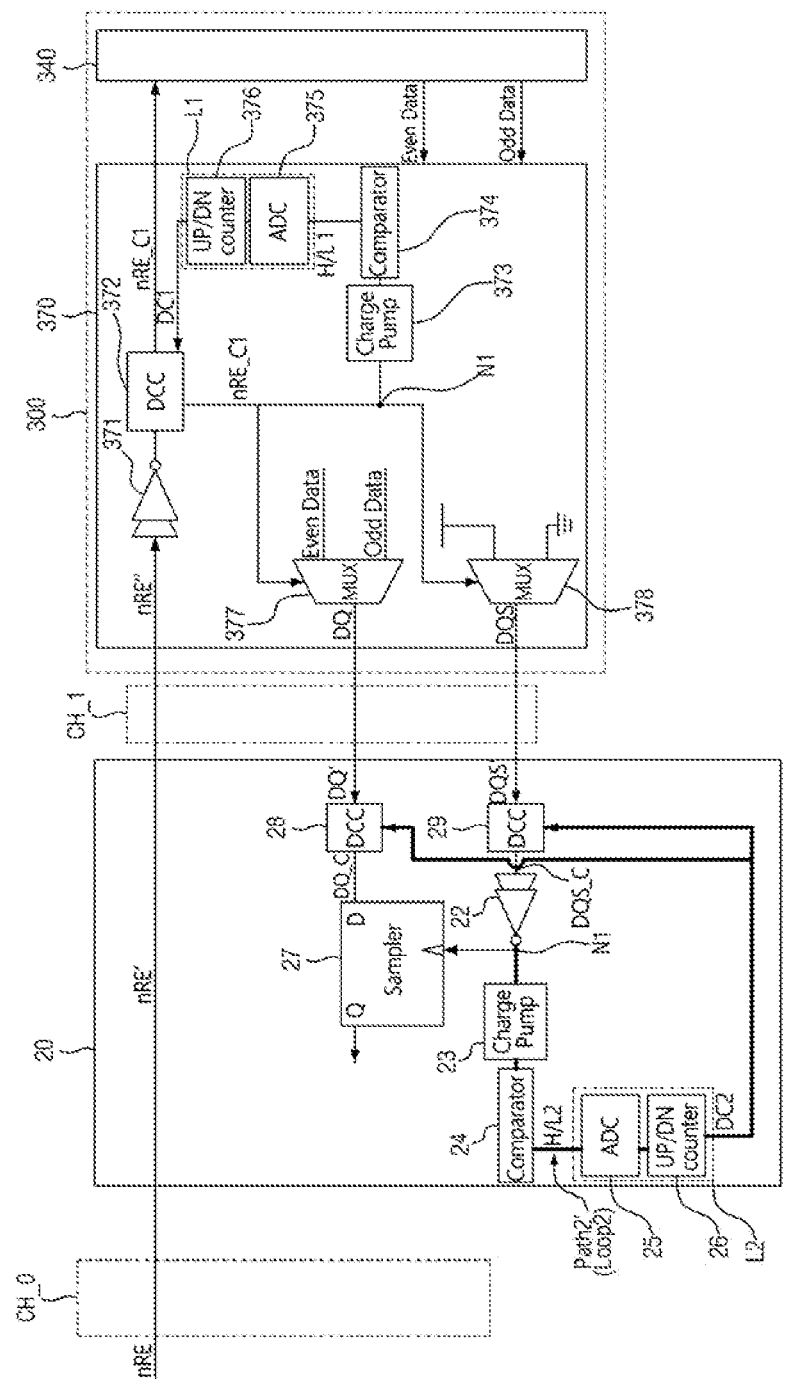
FIG. 17 illustrates a storage system according to example embodiments.

FIG. 17 illustrates a storage system according to example embodiments.

The storage system according to example embodiments will now be described with reference to FIG. 17. The following description will focus on differences from the storage system illustrated in FIG. 8.

Unlike in the embodiment of FIG. 8, a buffer 20 may include a data signal duty cycle corrector 28 and a data strobe signal duty cycle corrector 29 instead of the second duty cycle corrector 21.

A second charge pump 23, a second comparator 24, a second logic L2, the data signal duty cycle corrector 28, and the data strobe signal duty cycle corrector 29 may form a second path (second loop). The data signal duty cycle corrector 28 may receive a data signal DQ' through a first channel CH_1, and generate a corrected data signal DQ_C by performing a second duty correction operation on the data signal DQ'.

The data strobe signal duty cycle corrector 29 may receive a data strobe signal DQS' through the first channel CH_1, and generate a corrected data strobe signal DQS_C by performing a second duty correction operation on the data strobe signal DQS'.

Figure 18:
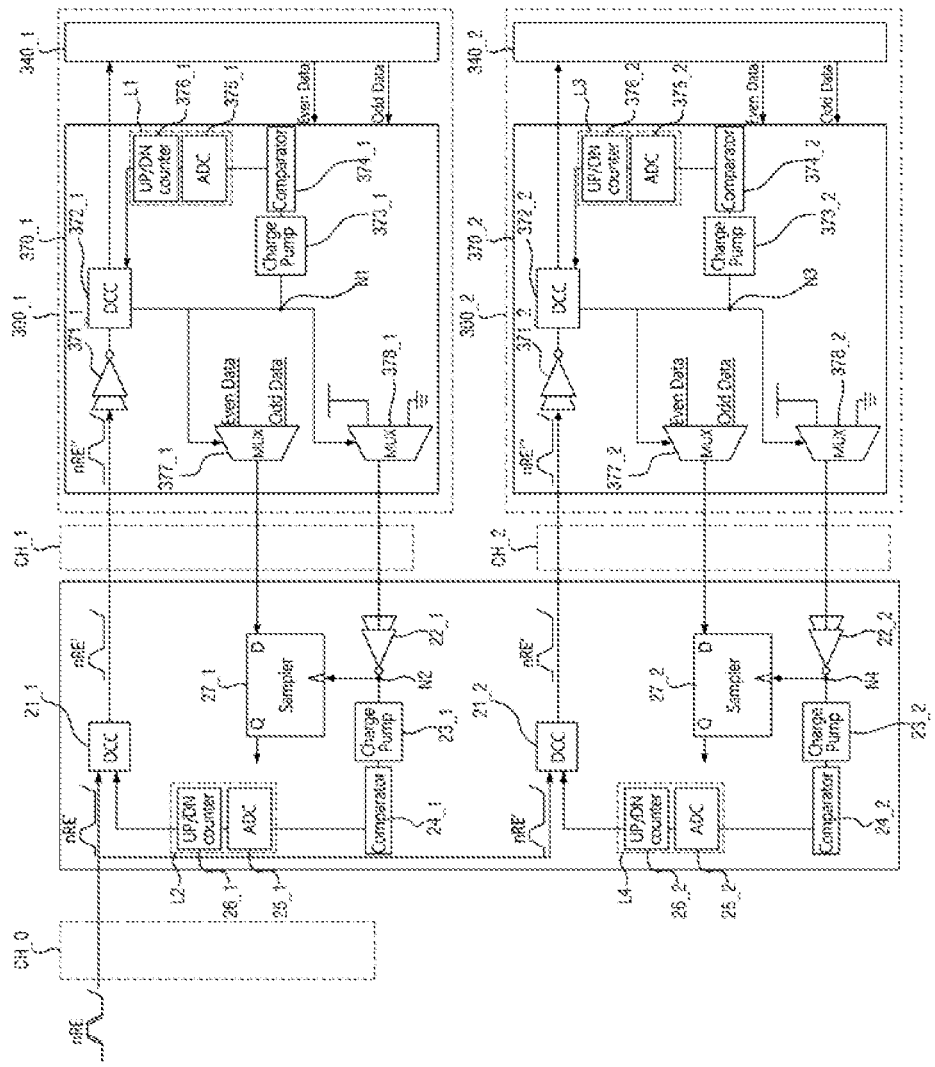
FIG. 18 illustrates a storage system according to example embodiments.

FIG. 18 illustrates a storage system according to example embodiments.

The storage system according to example embodiments will now be described with reference to FIG. 18. The following description will focus on differences from the storage system illustrated in FIG. 8.

The buffer 20 includes a second duty cycle corrector 21-1, a second internal circuit 22-1, a second charge pump 23-1, a second comparator 24-1, a second logic L2, a first sampler 27-1, a fourth duty cycle corrector 21-2, a fourth internal circuit 22-2, a fourth charge pump 23-2, a fourth comparator 24-2, a fourth logic L4, and a second sampler 27-2.

The second duty cycle corrector 21-1, the second internal circuit 22-1, the second charge pump 23-1, the second comparator 24-1, the second logic L2, and the first sampler 27-1 correspond to the second duty cycle corrector 21, the second internal circuit 22, the second charge pump 23, the second comparator 24, the second logic L2, and the sampler 27 of FIG. 4, respectively.

Likewise, the fourth duty cycle corrector 21-2, the fourth internal circuit 22-2, the fourth charge pump 23-2, the fourth comparator 24-2, the fourth logic L4, and the second sampler 27-2 correspond to the second duty cycle corrector 21, the second internal circuit 22, the second charge pump 23, the second comparator 24, the second logic L2, and the sampler 27 of FIG. 8, respectively.

The first nonvolatile memory 300_1 and the second nonvolatile memory 300_2 correspond to the nonvolatile memory 300 of FIG. 8.

The second duty cycle corrector 21-1 provides a read enable signal nRE" to the first nonvolatile memory 300_1 through a first channel CH_1. The fourth duty cycle corrector 21-2 provides a read enable signal nRE''' to the second nonvolatile memory 300_2 through a second channel CH_2 different from the first channel CH_1.

The read enable signal nRE" provided through the first channel CH_1 is different from the read enable signal nRE''' provided through the second channel CH_2 in the degree of duty distortion. Therefore, a duty correction operation on the read enable signal nRE" provided through the first channel CH_1 and a duty correction operation on the read enable signal nRE''' provided through the second channel CH_2 may be performed independently.

Figure 19:
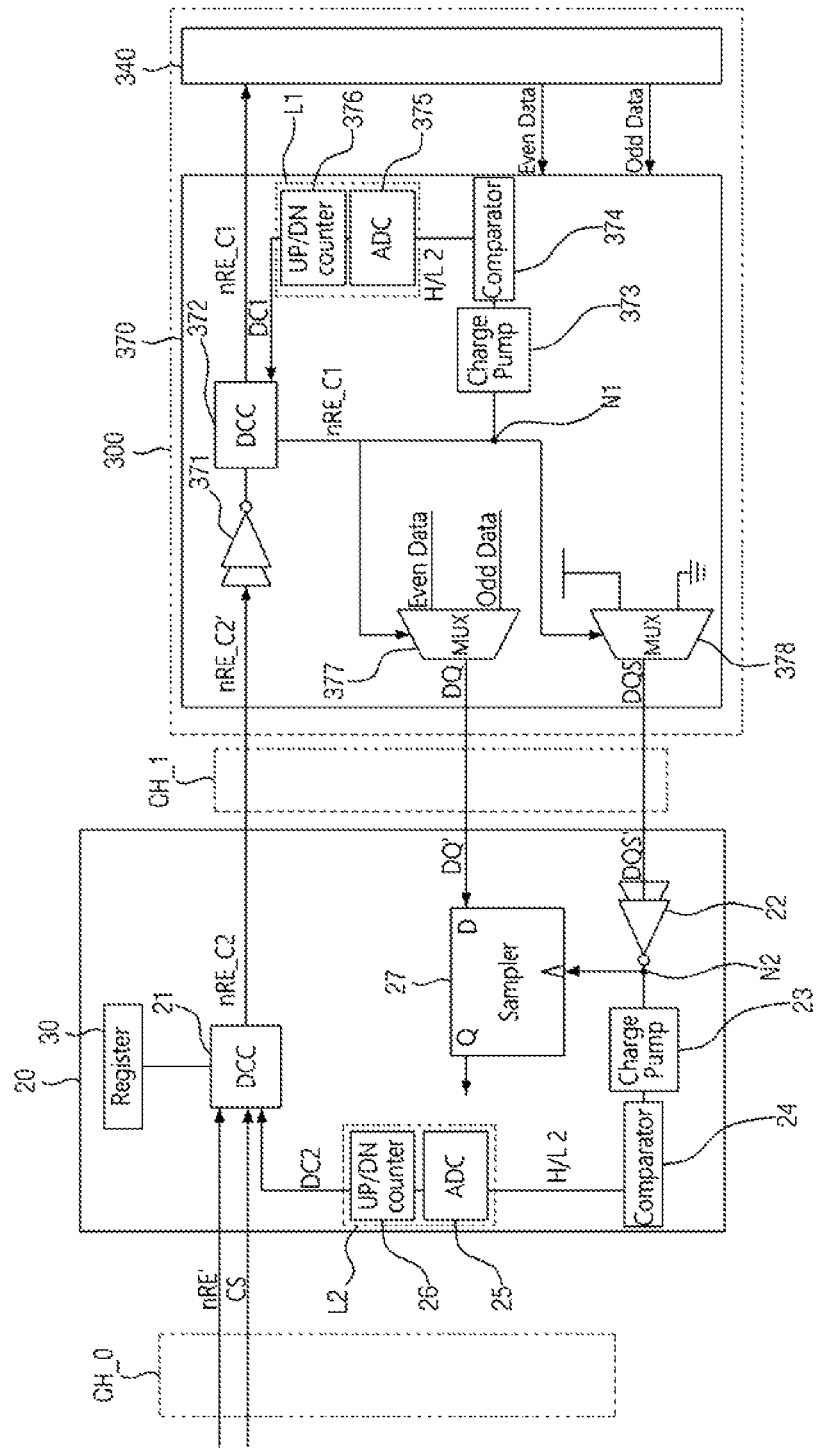
FIG. 19 illustrates a storage system according to example embodiments.

FIG. 19 illustrates a storage system according to example embodiments.

The storage system according to example embodiments will now be described with reference to FIG. 19. The following description will focus on differences from the storage system illustrated in FIG. 8.

When compared with the second duty cycle corrector 21 of FIG. 8, the second duty cycle corrector 21 of FIG. 19 additionally receives a chip select signal CS. The buffer 20 further includes a register 30 which stores a second digital code DC2 regarding the chip select signal CS.

When a second corrected read enable signal nRE_C2' is provided to a plurality of nonvolatile memories through the first channel CH_1 (through a same channel), the second digital code DC2 of the register 30 may be retrieved according to each chip select signal CS. Therefore, a second duty correction operation on a read enable signal nRE' may be performed differently for each chip to which the second corrected read enable signal nRE_C2' is to be provided.

Figure 20:
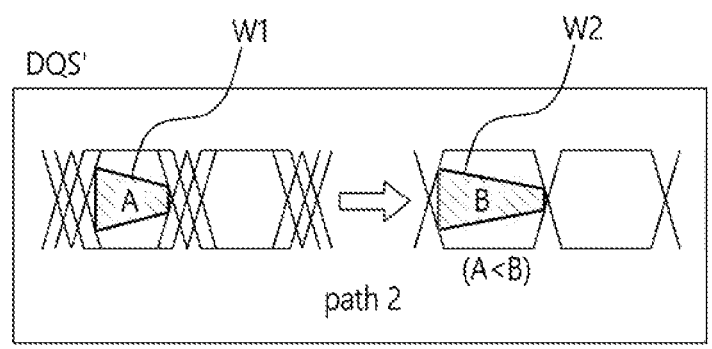
FIG. 20 is a diagram illustrating the effect of a storage system according to example embodiments.

FIG. 20 is a diagram illustrating the effect of a storage system according to example embodiments.

A data strobe signal DQS' with a distorted duty has a data valid window of area A. However, the data strobe signal DQS' can be made to have a data valid window larger than the area A through a second path (path 2).

As the length of a channel increases or the frequency of a read enable signal nRE increases, duty distortion may occur more frequently. A storage system according to example embodiments can enhance the data valid windows of both the read enable signal nRE and the data strobe signal DQS' used for a read operation through a plurality of loops.

By way of summation and review, increasing a toggling frequency of a toggle signal may result in an increase in the effect of a channel on the toggle signal and increase the non-linearity of the toggle signal, thereby increasing distortion of a duty of the toggle signal. When the duty is distorted, it may be difficult to secure a data valid window for the toggle signal, leading to a reduction in the speed and reliability of a system.

As described above, embodiments may provide a storage system whose speed and reliability are improved by securing a data valid window of data. Embodiments may also provide a storage system which performs a duty correction operation on a signal through a dual loop.

Embodiments according to the technical spirit of the present disclosure are described with reference to the accompanying drawings. In the description of FIGS. 1 through 20, substantially the same components are identified by the same reference characters, and any redundant description thereof will be omitted. In addition, similar components are identified by similar reference characters throughout the drawings of the present disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A storage system, comprising:
a memory controller which provides a clock signal;
a buffer which receives the clock signal output from the memory controller and re-drives the clock signal, the buffer including a sampler which receives a data signal and a data strobe signal regarding the data signal, and which outputs a data stream; and
a nonvolatile memory, including:
a first duty cycle corrector, which receives the clock signal through the buffer and outputs a corrected clock signal by performing a first duty correction operation on the clock signal; and
a data strobe signal generator, which generates the data strobe signal based on the corrected clock signal and provides the data strobe signal to the buffer,
wherein the buffer receives the data strobe signal output from the nonvolatile memory, senses a duty ratio of the data strobe signal input to the sampler, and performs a second duty correction operation on the duty ratio of the input data strobe signal,
wherein
the nonvolatile memory further includes a first comparator which senses a duty ratio of the clock signal and a first logic which generates a first digital code regarding the duty ratio of the clock signal, and
the buffer further includes a second comparator which senses the duty ratio of the data strobe signal input to the sampler and a second logic which generates a second digital code regarding the duty ratio of the data strobe signal.

2. The storage system as claimed in claim 1, wherein the buffer further includes a second duty cycle corrector which receives the clock signal and the second digital code, and performs the second duty correction operation on the clock signal.

3. The storage system as claimed in claim 1, wherein the buffer further includes a second duty cycle corrector which receives the second digital code, and performs the second duty correction operation by performing a duty correction operation on the data strobe signal.

4. The storage system as claimed in claim 1, wherein the clock signal is a read enable signal which toggles at a predetermined frequency in a read operation of the nonvolatile memory.

5. The storage system as claimed in claim 4, wherein the nonvolatile memory further includes a memory cell array which stores data and reads the data of the memory cell array using the corrected clock signal.

6. The storage system as claimed in claim 1, wherein:
the nonvolatile memory includes a first nonvolatile memory and a second nonvolatile memory different from the first nonvolatile memory,
the first nonvolatile memory includes a first duty cycle corrector which receives the clock signal through the buffer and outputs a first corrected clock signal by performing a first duty correction operation on the clock signal, and includes a first data strobe signal generator which generates a first data strobe signal based on the first corrected clock signal and provides the first data strobe signal to the buffer,
the second nonvolatile memory includes a second duty cycle corrector which receives the clock signal through the buffer and outputs a second corrected clock signal by performing a second duty correction operation on the clock signal, and includes a second data strobe signal generator which generates a second data strobe signal based on the second corrected clock signal and provides the second data strobe signal to the buffer, and
the buffer receives the first data strobe signal and performs a third duty correction operation on a duty ratio of the first data strobe signal, and receives the second data strobe signal and performs a fourth duty correction operation on a duty ratio of the second data strobe signal.

7. The storage system as claimed in claim 6, wherein the first nonvolatile memory and the second nonvolatile memory receive the clock signal from the buffer through the same channel.

8. The storage system as claimed in claim 7, wherein:
the memory controller provides a chip select signal to the buffer together with the clock signal, and
the buffer further includes a register which stores a plurality of digital codes corresponding to the chip select signal.

9. The storage system as claimed in claim 6, wherein:
the first nonvolatile memory receives the clock signal from the buffer through a first channel, and
the second nonvolatile memory receives the clock signal from the buffer through a second channel different from the first channel.

10. A storage system, comprising:
a memory controller which provides a clock signal;
a buffer which receives the clock signal from the memory controller and re-drives the clock signal; and
a nonvolatile memory which includes a first comparator sensing a duty ratio of the clock signal, a first logic generating a first digital code regarding the duty ratio of the clock signal, a first duty cycle corrector receiving the clock signal and the first digital code and outputting a corrected clock signal by performing a first duty correction operation on the clock signal, and a data strobe signal generator generating a data strobe signal based on the corrected clock signal and providing the data strobe signal to the buffer,
wherein the buffer includes a second comparator which senses a duty ratio of the data strobe signal received from the nonvolatile memory, a second logic which generates a second digital code regarding the duty ratio of the data strobe signal, and a second duty cycle corrector which receives the clock signal and the second digital code and performs a second duty correction operation on the clock signal.

11. The storage system as claimed in claim 10, wherein the buffer includes a sampler which receives the data strobe signal and outputs a data stream.

12. The storage system as claimed in claim 11, wherein the first comparator senses the duty ratio of the clock signal input to the nonvolatile memory.

13. The storage system as claimed in claim 11, wherein the second duty cycle corrector corrects the duty ratio of the data strobe signal input to the sampler by performing the second duty correction operation on the clock signal.

14. The storage system as claimed in claim 10, wherein the nonvolatile memory further includes a memory cell array which stores data and reads the data of the memory cell array using the corrected clock signal.

15. A storage system, comprising:
a memory controller which provides a clock signal;
a buffer which receives the clock signal output from the memory controller and re-drives the clock signal;
a first nonvolatile memory which includes a first duty cycle corrector receiving the clock signal from the buffer through a first channel and outputting a first corrected clock signal by performing a first duty correction operation on the clock signal, and includes a first data strobe signal generator generating a first data strobe signal based on the first corrected clock signal and providing the first data strobe signal to the buffer; and
a second nonvolatile memory which includes a second duty cycle corrector receiving the clock signal from the buffer through a second channel different from the first channel and outputting a second corrected clock signal by performing a second duty correction operation on the clock signal, and includes a second data strobe signal generator generating a second data strobe signal based on the second corrected clock signal and providing the second data strobe signal to the buffer, wherein the buffer senses a first duty ratio of the first data strobe signal received from the first nonvolatile memory through the first channel, performs a third duty correction operation on the first duty ratio, senses a second duty ratio of the second data strobe signal received from the second nonvolatile memory through the second channel, and performs a fourth duty correction operation on the second duty ratio, wherein:

the first nonvolatile memory further includes a first comparator which senses a duty ratio of the clock signal, and a first logic which generates a first digital code regarding the duty ratio of the clock signal, the second nonvolatile memory further includes a second comparator which senses the duty ratio of the clock signal, and a second logic which generates a second digital code regarding the duty ratio of the clock signal, and the buffer further includes a third comparator which senses the first duty ratio of the first data strobe signal, a third logic which generates a third digital code regarding the first duty ratio of the first data strobe signal, a fourth comparator which senses the second duty ratio of the second data strobe signal, and a fourth logic which generates a fourth digital code regarding the second duty ratio of the second data strobe signal.

16. The storage system as claimed in claim 15, wherein:

the buffer further includes a first sampler which receives the first data strobe signal and outputs a first data stream and a second sampler which receives the second data strobe signal and outputs a second data stream, the third comparator senses the first duty ratio of the first data strobe signal input to the first sampler, and the fourth comparator senses the second duty ratio of the second data strobe signal input to the second sampler.

17. The storage system as claimed in claim 15, wherein the buffer further includes:

a third duty cycle corrector which receives the clock signal and the third digital code and performs the third duty correction operation by performing a duty correction operation on the clock signal; and a fourth duty cycle corrector which receives the clock signal and the fourth digital code and performs the fourth duty correction operation by performing a duty correction operation on the clock signal.

18. The storage system as claimed in claim 15, wherein:

the first nonvolatile memory further includes a first memory cell array which stores first data, the second nonvolatile memory further includes a second memory cell array which stores second data, the first nonvolatile memory reads the first data of the first memory cell array using the first corrected clock signal, and the second nonvolatile memory reads the second data of the second memory cell array using the second corrected clock signal.

* * * * *